(12) United States Patent
Griffin et al.

(10) Patent No.: US 12,387,916 B2
(45) Date of Patent: Aug. 12, 2025

(54) MAGNETIC FIELD CONTROL SYSTEM

(71) Applicant: Lam Research Corporation, Fremont, CA (US)

(72) Inventors: Alecia Chantalle Griffin, San Jose, CA (US); Anthony de la Llera, Fremont, CA (US); Peter Bradley Phillips, Clayton, CA (US); Bing Ji, Pleasanton, CA (US)

(73) Assignee: Lam Research Corporation, Fremont, CA (US)

( * ) Notice: Subject to any disclaimer, the term of this patent is extended or adjusted under 35 U.S.C. 154(b) by 163 days.

(21) Appl. No.: 18/013,489

(22) PCT Filed: May 17, 2022

(86) PCT No.: PCT/US2022/029634
§ 371 (c)(1),
(2) Date: Dec. 28, 2022

(87) PCT Pub. No.: WO2022/245824
PCT Pub. Date: Nov. 24, 2022

(65) Prior Publication Data
US 2023/0282455 A1 Sep. 7, 2023

Related U.S. Application Data

(60) Provisional application No. 63/201,965, filed on May 20, 2021.

(51) Int. Cl.
*H01J 37/32* (2006.01)
*H01J 37/34* (2006.01)
(52) U.S. Cl.
CPC ...... *H01J 37/3266* (2013.01); *H01J 37/3444* (2013.01); *H01J 37/3244* (2013.01)

(58) Field of Classification Search
CPC . H01J 37/3266; H01J 37/3444; H01J 37/3244
See application file for complete search history.

(56) References Cited

U.S. PATENT DOCUMENTS

| 2004/0045506 A1 | 3/2004 | Chen et al. |
| 2014/0273304 A1 | 9/2014 | Garcia De Gorordo et al. |

(Continued)

FOREIGN PATENT DOCUMENTS

| KR | 20100006483 A | 1/2010 | |
| WO | WO-2013074354 A1 * | 5/2013 | ........ H01J 37/32082 |
| WO | WO-2022245824 A1 | 11/2022 | |

OTHER PUBLICATIONS

International Application Serial No. PCT/US2022/029634, International Search Report mailed Sep. 7, 2022, 3 pgs.

(Continued)

*Primary Examiner* — Henry Luong
(74) *Attorney, Agent, or Firm* — Schwegman Lundberg & Woessner, P.A.

(57) ABSTRACT

A substrate processing apparatus includes a vacuum chamber with a processing zone for processing a substrate using plasma and at least one magnetic field source configured to generate one or more active magnetic fields through the processing zone. The apparatus also includes a magnetic field sensor configured to detect a signal representing the one or more active magnetic fields, and a controller coupled to the magnetic field sensor, and the at least one magnetic field source. The controller is configured to detect a target value corresponding to at least one characteristic of the one or more active magnetic fields, set an initial current through the at least one magnetic field source, the initial current corresponding to the target value; and adjust a subsequent current through the at least one magnetic field source based on the detected signal representing the one or more active magnetic fields.

24 Claims, 13 Drawing Sheets

(56) References Cited

U.S. PATENT DOCUMENTS

2016/0027613 A1     1/2016   Lane et al.
2016/0300697 A1    10/2016   Whang et al.

OTHER PUBLICATIONS

International Application Serial No. PCT/US2022/029634, Written Opinion mailed Sep. 7, 2022, 3 pgs.
International Application Serial No. PCT/US2022/029634, International Preliminary Report jon Patentability mailed Nov. 30, 2023, 5 pgs.

* cited by examiner

MAGNETIC FIELD CONTROL SYSTEM

CLAIM OF PRIORITY

This application is a U.S. National Stage Filing under 35 U.S.C. 371 from International Application No. PCT/US2022/029634, filed on May 17, 2022, and published as WO 2022/245824 A1 on Nov. 24, 2022, which claims the benefit of priority to U.S. Provisional Patent Application No. 63/201,965, filed on May 20, 2021, each of which is incorporated by reference herein in its entirety.

TECHNICAL FIELD

The subject matter disclosed herein generally relates to methods, systems, and machine-readable storage media for controlling magnetic fields used in plasma-based substrate manufacturing, such as capacitively coupled plasma (CCP) or inductively coupled plasma (ICP) substrate manufacturing.

BACKGROUND

Semiconductor substrate processing systems are used to process semiconductor substrates by techniques including etching, physical vapor deposition (PVD), chemical vapor deposition (CVD), plasma-enhanced chemical vapor deposition (PECVD), atomic layer deposition (ALD), plasma-enhanced atomic layer deposition (PEALD), pulsed deposition layer (PDL), plasma-enhanced pulsed deposition layer (PEPDL), and resist removal. One type of semiconductor substrate processing apparatus is a plasma processing apparatus using CCP that includes a vacuum chamber containing upper and lower electrodes, where a radio frequency (RF) power is applied between the electrodes to excite a process gas into plasma for processing semiconductor substrates in the reaction chamber. Another type of semiconductor substrate processing apparatus is a plasma processing apparatus ICP.

In semiconductor substrate processing systems, such as the CCP-based or ICP-based vacuum chambers for manufacturing substrates, etch uniformity and ion tilt at the substrate center are influenced by plasma density uniformity, which has shown sensitivity to weak magnetic fields. For example, plasma density uniformity in CCP-based and ICP-based vacuum chambers can be influenced by magnetic fields associated with magnetized chamber components (which may be associated with a magnetic field strength of 5-10 Gauss) as well as other external magnetic fields including the Earth's magnetic field (which may have a magnetic field strength of 0.25-0.65 Gauss) or other ambient magnetic fields (which may have a magnetic field strength of 0.4-0.5 Gauss).

Currently, tuning plasma uniformity, particularly at the center of the substrate and across the substrate surface, is a challenge. Changing the dimension of the ground electrode within the chamber, gas and chemistry flows or the frequency content of delivered radio frequency (RF) are the main factors used to control the plasma uniformity. However, the magnetization of processing chamber components as well as exposure to external magnetic fields influences plasma density uniformity and varies greatly from chamber to chamber within a manufacturing location, as well as between chambers at different manufacturing locations. Improvements in hardware design and utilization of process knobs have thus far addressed the industry's need for stringent plasma uniformity requirements. Nevertheless, uniformity specifications have become increasingly demanding and additional techniques are needed for controlling magnetic fields to achieve extremely uniform densities across the entire substrate surface. The present disclosure seeks to address, amongst other things, the drawbacks associated with conventional techniques for plasma density uniformity.

The background description provided herein is to generally present the context of the disclosure. It should be noted that the information described in this section is presented to provide the skilled artisan some context for the following disclosed subject matter and should not be considered as admitted prior art. More specifically, work of the presently named inventors, to the extent it is described in this background section, as well as aspects of the description that may not otherwise qualify as prior art at the time of filing, are neither expressly nor impliedly admitted as prior art against the present disclosure.

SUMMARY

Methods, systems, and computer programs are presented for controlling magnetic fields in connection with substrate manufacturing. One general aspect includes a substrate processing apparatus. The apparatus includes a vacuum chamber including a processing zone for processing a substrate using plasma. The apparatus further includes at least one magnetic field source configured to generate one or more active magnetic fields through the processing zone of the vacuum chamber. The apparatus further includes a magnetic field sensor configured to detect a signal representing the one or more active magnetic fields. The apparatus further includes a controller coupled to the magnetic field sensor and the at least one magnetic field source. To perform adjustment of the one or more magnetic field sources, the controller is configured to determine a target value corresponding to at least one characteristic of the one or more active magnetic fields. The controller is further configured to set an initial current through the at least one magnetic field source, the initial current corresponding to the target value. The controller is further configured to adjust a subsequent current through the at least one magnetic field source based on the detected signal representing the one or more active magnetic fields.

Another general aspect includes a magnetic field controller. The controller includes a first terminal coupled to a direct current (DC) voltage source and a second terminal communicatively coupled to one or more vacuum chambers. Each of the one or more vacuum chambers includes a processing zone for processing a substrate using plasma. The controller further includes a third terminal communicatively coupled to one or more magnetic field sources. Each of the one or more magnetic field sources is configured to generate one or more active magnetic fields through the processing zone of at least one of the one or more vacuum chambers. The controller further includes a fourth terminal communicatively coupled to one or more magnetic field sensors configured to detect a signal representing the one or more active magnetic fields. The controller further includes processing circuitry communicatively coupled to the first, second, third, and fourth terminals. To perform adjustment of the one or more magnetic field sources, the processing circuitry is configured to determine a target value corresponding to at least one characteristic of the one or more active magnetic fields. The processing circuitry is further to set an initial current through the one or more magnetic field sources, the initial current corresponding to the target value. The processing circuitry is further to adjust a subsequent current through the one or more magnetic field sources based on the detected signal representing the one or more active magnetic fields.

Yet another general aspect includes a method of controlling a magnetic field in a vacuum chamber. The method includes determining a target value corresponding to at least one characteristic of one or more active magnetic fields through a processing zone of the vacuum chamber. The method further includes setting an initial current through at least one magnetic field source to generate the one or more active magnetic fields, the initial current corresponding to the target value. The method further includes adjusting a subsequent current through the at least one magnetic field source based on a signal representing the one or more active magnetic fields, the signal detected via a magnetic field sensor associated with the at least one magnetic field source.

An additional general aspect includes a non-transitory machine-readable storage medium including instructions that, when executed by a machine, cause the machine to perform operations for controlling a magnetic field in a vacuum chamber. The operations include determining a target value corresponding to at least one characteristic of one or more active magnetic fields through a processing zone of the vacuum chamber. The operations further include setting an initial current through at least one magnetic field source to generate the one or more active magnetic fields, the initial current corresponding to the target value. The operations further include adjusting a subsequent current through the at least one magnetic field source based on a signal representing the one or more active magnetic fields, the signal detected via a magnetic field sensor associated with the at least one magnetic field source.

BRIEF DESCRIPTION OF THE DRAWINGS

Various ones of the appended drawings merely illustrate example embodiments of the present disclosure and cannot be considered as limiting its scope.

DETAILED DESCRIPTION

Figure 1:
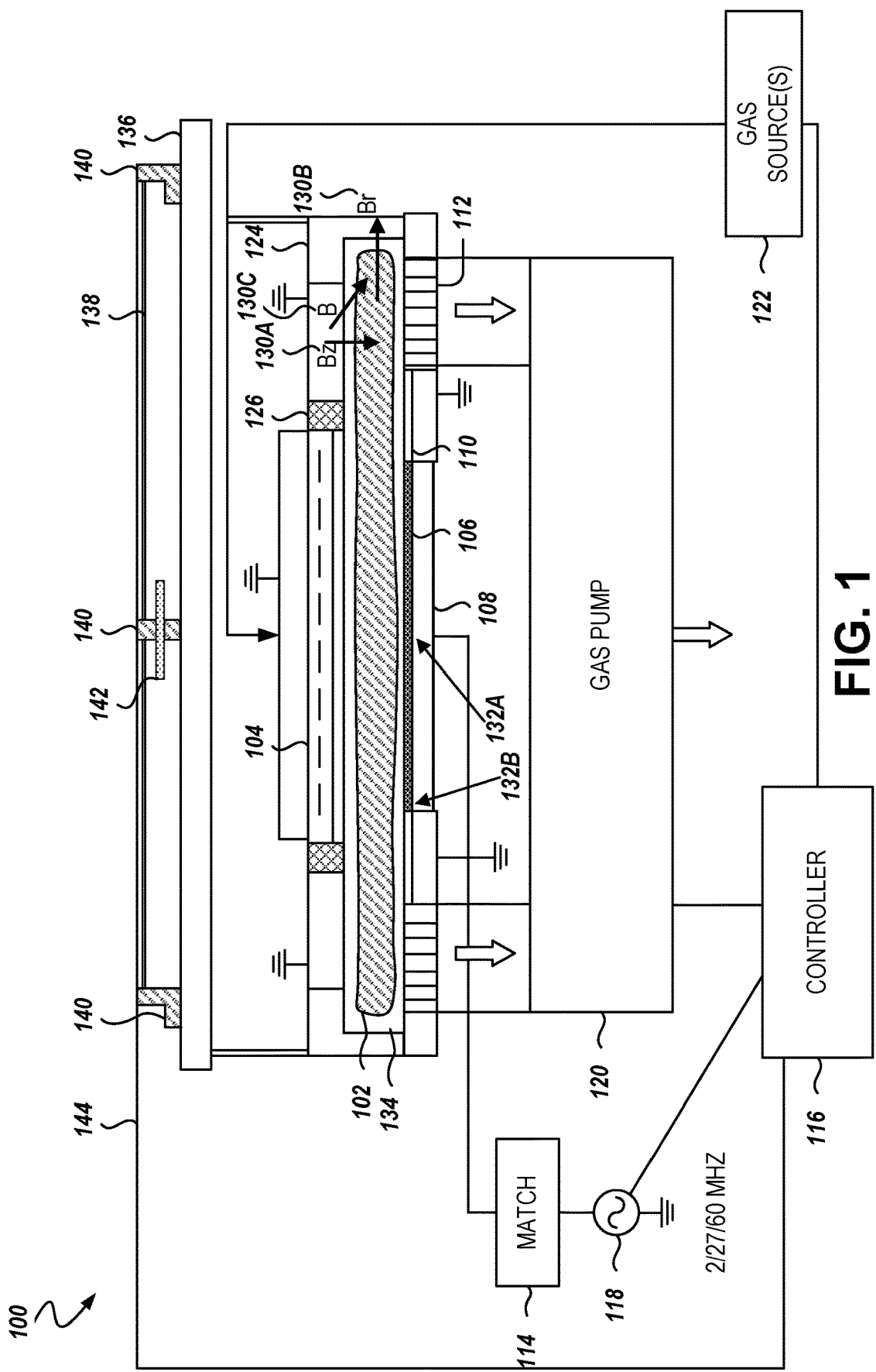
FIG. 1 illustrates a vacuum chamber, such as an etching chamber, for manufacturing substrates, according to some example embodiments.

Example methods, systems, and computer programs are directed to controlling magnetic fields in substrate manufacturing equipment using a magnetic field controller. Examples merely typify possible variations. Unless explicitly stated otherwise, components and functions are optional and may be combined or subdivided, and operations may vary in sequence or be combined or subdivided. In the following description, for purposes of explanation, numerous specific details are set forth to provide a thorough understanding of example embodiments. It will be evident to one skilled in the art, however, that the present subject matter may be practiced without these specific details.

Substrate uniformity across the substrate surface is challenging to control since it depends on etch process conditions. When conditions change, uniformity may change as well. Static solutions to control plasma uniformity (such as adjusting the ground electrode dimension) may not perform efficiently over a wide range of process conditions. Solutions involving process parameters may lead to unwanted side effects when modified to address uniformity.

Techniques discussed herein use a magnetic field controller to manage magnetic fields (e.g., axial and/or radial magnetic fields) within a vacuum chamber to control plasma uniformity. As used herein, the term "axial magnetic field" indicates a magnetic field that is orthogonal to a surface of a substrate within a vacuum chamber. As used herein, the term "radial magnetic field" indicates a magnetic field that is parallel to a surface of the substrate within the vacuum chamber. By using the disclosed magnetic field controller, the versatility and effectiveness of magnetic fields in one or more vacuum chambers may be maximized. For example, the disclosed magnetic field controller may be used for configuring and managing radial magnetic fields (which may enhance the plasma density across the substrate) and axial magnetic fields (which may suppress the plasma density at the substrate center). In some aspects, the disclosed magnetic fields may be used to compensate/cancel residual magnetic fields for better uniformity and chamber matching. In other aspects, the disclosed magnetic fields may also be used to actively change plasma uniformity to achieve a desired etch uniformity, even in the absence of any ambient (or residual) magnetic fields. For this purpose, magnetic fields that are stronger than the residual magnetic fields may be needed, and the residual magnetic fields may be considered less significant for this purpose. In this regard, the desired magnetic fields may be dictated by the etch uniformity requirement (which may vary according to processing conditions or recipe steps associated with a process flow performed within the vacuum chamber), and the disclosed magnetic field controller and magnetic field source may be used to deliver the desired magnetic fields. Such magnetic field is also referred to herein as an "active field" or an "active magnetic field." Consequently, the disclosed magnetic field controller may be used for managing individual radial or axial active magnetic fields, as well as a combination of both radial and axial active magnetic fields for chamber matching (e.g., by compensating/canceling residual magnetic fields) and for controlling plasma density across the entire surface of the substrate within the vacuum chamber of one or more substrate processing apparatuses (such as CCP-based or ICP-based substrate processing apparatuses) in order to achieve desired etch uniformity. Various techniques and options for configuring active magnetic fields using a magnetic field controller are illustrated in connection with FIG. 1-FIG. 13.

FIG. 1 illustrates a vacuum chamber 100 (e.g., an etching chamber) for manufacturing substrates, according to one embodiment. Exciting an electric field between two electrodes is one of the methods to obtain radio frequency (RF) gas discharge in a vacuum chamber. When an oscillating voltage is applied between the electrodes, the discharge obtained is referred to as a CCP discharge.

Plasma 102 may be created utilizing stable feedstock gases to obtain a wide variety of chemically reactive by-products created by the dissociation of the various molecules caused by electron-neutral collisions. The chemical aspect of etching involves the reaction of the neutral gas molecules and their dissociated by-products with the molecules of the to-be-etched surface and producing volatile molecules, which can be pumped away. When a plasma is created, the positive ions are accelerated from the plasma across a space-charge sheath separating the plasma from chamber walls to strike the substrate surface with enough energy to remove material from the substrate surface. The process of using highly energetic and chemically reactive ions to selectively and anisotropically remove materials from a substrate surface is called reactive ion etch (RIE). This invention improves RIE uniformity by controlling plasma density and sheath uniformity using axial and radial magnetic fields.

A controller 116 (also referred to as a magnetic field controller or MFC) manages the operation of the vacuum chamber 100 by controlling the different elements in the chamber, such as RF generator 118, gas sources 122, and gas pump 120. In one embodiment, fluorocarbon gases, such as $CF_4$ and $C_4F_8$, are used in a dielectric etch process for their anisotropic and selective etching capabilities, but the principles described herein can be applied to other plasma-creating gases. The fluorocarbon gases are readily dissociated into chemically reactive by-products that include smaller molecular and atomic radicals. These chemically reactive by-products etch away the dielectric material.

The vacuum chamber 100 illustrates a processing chamber with a top electrode 104 and a bottom electrode 108. The top electrode 104 may be grounded or coupled to an RF generator (not shown), and the bottom electrode 108 is coupled to the RF generator 118 via a matching network 114. The RF generator 118 provides RF power in one or multiple (e.g., two or three) different RF frequencies. According to the desired configuration of the vacuum chamber 100 for a particular operation, at least one of the multiple RF frequencies may be turned on or off. In the embodiment shown in FIG. 1, the RF generator 118 is configured to provide at least three different frequencies, e.g., 400 kHz, 2 MHz, 27 MHz, and 60 MHz, but other frequencies are also possible.

The vacuum chamber 100 includes a gas showerhead on the top electrode 104 to input process gas into the vacuum chamber 100 provided by the gas source(s) 122, and a perforated confinement ring 112 that allows the gas to be pumped out of the vacuum chamber 100 by gas pump 120. In some example embodiments, the gas pump 120 is a turbomolecular pump, but other types of gas pumps may be utilized.

When substrate 106 is present in the vacuum chamber 100, silicon focus ring 110 is situated next to substrate 106 such that there is a uniform RF field at the bottom surface of the plasma 102 for uniform etching on the surface of the substrate 106. The embodiment of FIG. 1 shows a triode reactor configuration where the top electrode 104 is surrounded by a symmetric RF ground electrode 124. Insulator 126 is a dielectric that isolates the ground electrode 124 from the top electrode 104. Other implementations of the vacuum chamber 100, including ICP-based implementations, are also possible without changing the scope of the disclosed embodiments.

The substrate 106 can include, for example, wafers (e.g., having a diameter of 100 mm, 150 mm, 200 mm, 300 mm, 450 mm, or larger) and comprising, for example, elemental-semiconductor materials (e.g., silicon (Si) or germanium (Ge)) or compound-semiconductor materials (e.g., silicon germanium (SiGe) or gallium arsenide (GaAs)). Additionally, other substrates include, for example, dielectric materials such as quartz or sapphire (onto which semiconductor materials may be applied).

Each frequency generated by the RF generator 118 may be selected for a specific purpose in the substrate manufacturing process. In the example of FIG. 1, with RF powers provided at 400 kHz, 2 MHz, 27 MHz, and 60 MHz, the 400 kHz or 2 MHz RF power provides ion energy control, and the 27 MHz and 60 MHz powers provide control of the plasma density and the dissociation patterns of the chemistry. This configuration, where each RF power may be turned ON or OFF, enables certain processes that use ultra-low ion energy on the substrates or wafers, and certain processes (e.g., soft etch for low-k materials) where the ion energy has to be low (e.g., under 700 or 200 eV).

In another embodiment, a 60 MHz RF power is used on the top electrode 104 to get ultra-low energies and very high density. This configuration allows chamber cleaning with high-density plasma when substrate 106 is not in the vacuum chamber 100 while minimizing sputtering on the electrostatic chuck (ESC) surface. The ESC surface is exposed when substrate 106 is not present, and any ion energy on the surface should be avoided, which is why the bottom 2 MHz and 27 MHz power supplies may be off during cleaning.

In some aspects, the vacuum chamber 100 is exposed to external magnetic fields, such as the Earth's magnetic field or other ambient magnetic fields (e.g., magnetic fields from magnetized components of the vacuum chamber such as a hoist). The resulting residual magnetic field 130C in the vacuum chamber 100 includes an axial magnetic field 130A (with a magnitude Bz) and a radial magnetic field 130B (with a magnitude Br). The residual magnetic field 130C is undesirable as it may negatively impact etch rate and plasma uniformity especially around a center region 132A or edge regions 132B of the substrate 106 within the processing zone 134. In an example embodiment, one or more active magnetic fields may be introduced within the processing zone 134 to counter the effects of the residual magnetic field and improve plasma uniformity. For example, one or more active magnetic fields may be introduced by one or more magnetic field sources (e.g., coils), which may be configured, monitored, and controlled via the MFC 116 and magnetic field source 138. In some aspects, the one or more active magnetic fields may include one or more axial active magnetic fields (e.g., to counter the effect of the axial magnetic field 130A) and one or more radial active magnetic fields (e.g., to counter the effect of the radial magnetic field 130B) introduced within the processing zone 134 so that a magnitude of each of the one or more active magnetic fields (or a ratio of magnitudes of at least two active magnetic fields) reaches a threshold, facilitating plasma uniformity across the surface of the substrate 106 within the processing zone 134.

In an example embodiment, the MFC 116 further configures and manages the operation of one or more magnetic field sources (e.g., magnetic field source 138 which can include a coil) used for generating the one or more active magnetic fields. For example, MFC 116 configures and manages the operation of magnetic field source 138 via communication link 144. In some embodiments, the magnetic field source 138 is a coil mounted on a top plate 136 of the vacuum chamber 100 via support structure 140. In some aspects, the MFC 116 uses a magnetic field sensor 142 configured to detect a signal representing the one or more active magnetic fields. For example, the MFC 116 may use the detected signal to determine one or more of a current through the one or more magnetic field sources, the magnitude of the one or more active magnetic fields, or polarity of the one or more active magnetic fields. The determined signal representing the one or more active magnetic fields may be used by the MFC 116 for adjusting a current through the one or more magnetic field sources. Example functionalities performed by the MFC 116 using the detected signal from the magnetic field sensor 142 are discussed in connection with FIG. 5 and FIG. 12. In some embodiments, the sensor 142 may be placed in a horizontal plane that is parallel to a horizontal plane of the substrate 106. Additionally, sensor 142 may be placed so that a vertical axis of the sensor (e.g., an axis that is orthogonal to the horizontal plane) is parallel with (or coincides with) a vertical axis (e.g., a center vertical axis) of the substrate 106.

In some aspects, a first active magnetic field source (e.g., a first coil disposed along a first surface of the vacuum chamber) is used for generating an axial active magnetic field (e.g., to counter the effect of the axial magnetic field 130A) and a second active magnetic field source (e.g., a second coil that is placed orthogonally in relation to the first coil and along a second surface of the vacuum chamber) is used for generating a radial active magnetic field (e.g., to counter the effect of the radial magnetic field 130B).

In other aspects when compensation (or canceling) of residual magnetic fields for chamber matching is desired, a target value corresponding to at least one characteristic of the one or more active magnetic fields (e.g., current, magnitude or polarization) may be determined a priori (e.g., before using the vacuum chamber for processing the substrate 106) based on known characteristics (e.g., polarity and magnitude) of the residual magnetic field 130C. In other aspects, the target value corresponding to the at least one characteristic of the one or more active magnetic fields (e.g., current, magnitude, or polarization) may be determined a priori (e.g., based on vacuum chamber processing conditions or vacuum chamber process flow steps (also referred to as recipe)) to actively change plasma uniformity to achieve a desired etch uniformity. In some aspects, the target value may be obtained (or detected) by the MFC 116 after the target value is entered via a user interface (e.g., at least one of the user interfaces illustrated in FIG. 6-FIG. 8). The MFC 116 may set an initial current through the one or more magnetic field sources, where the initial current corresponds to the detected target value. The MFC 116 may periodically adjust a subsequent current based on the detected signal (from sensor 142) representing the one or more active magnetic fields. As part of the adjusting, the MFC 116 may measure the subsequent current first and determine an adjustment based on the detected signal (from sensor 142) representing the one or more active magnetic fields.

Figure 3A:
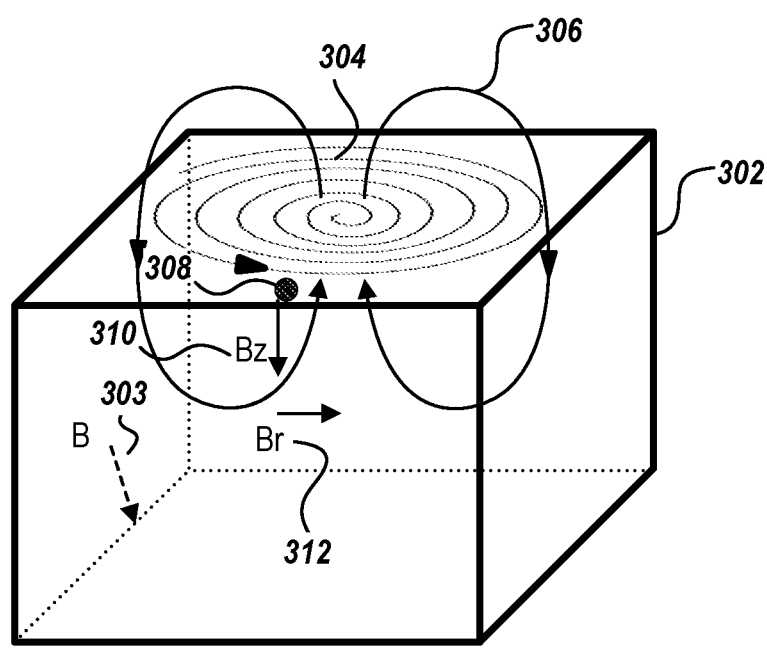
FIG. 3A illustrates a perspective view of a vacuum chamber with a coil used as a magnetic field source for axial and radial active magnetic fields, according to some example embodiments.
Figure 3B:
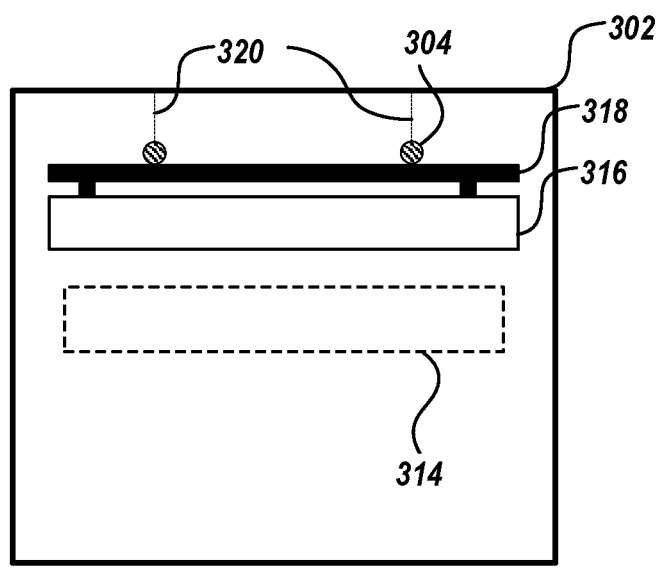
FIG. 3B is a side view of the vacuum chamber of FIG. 3A illustrating mounting options for the magnetic field source, according to some example embodiments.
Figure 4:
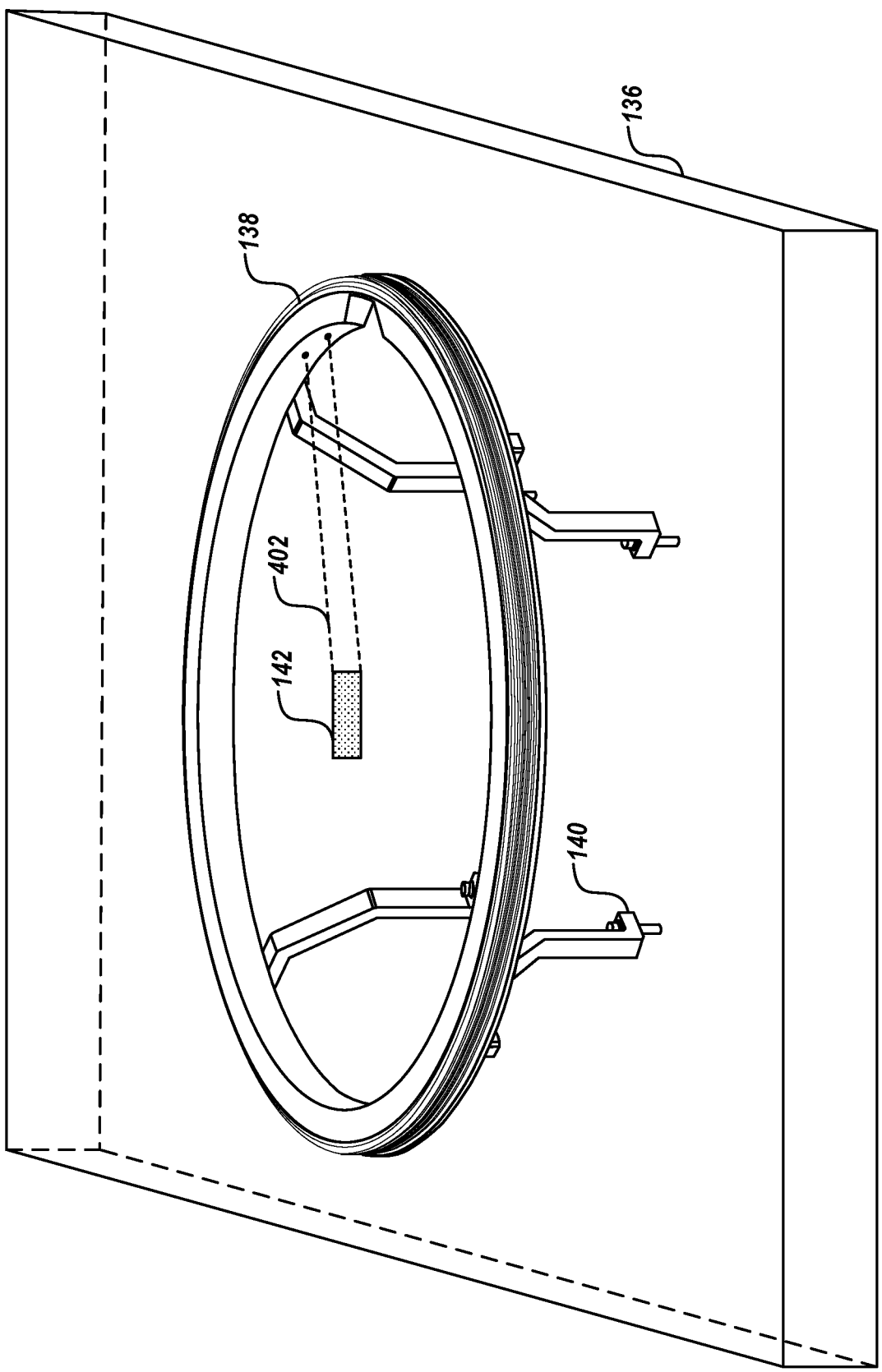
FIG. 4 illustrates an example magnetic field source mounted on a top plate of the vacuum chamber of FIG. 1, according to some embodiments.
Figure 5:
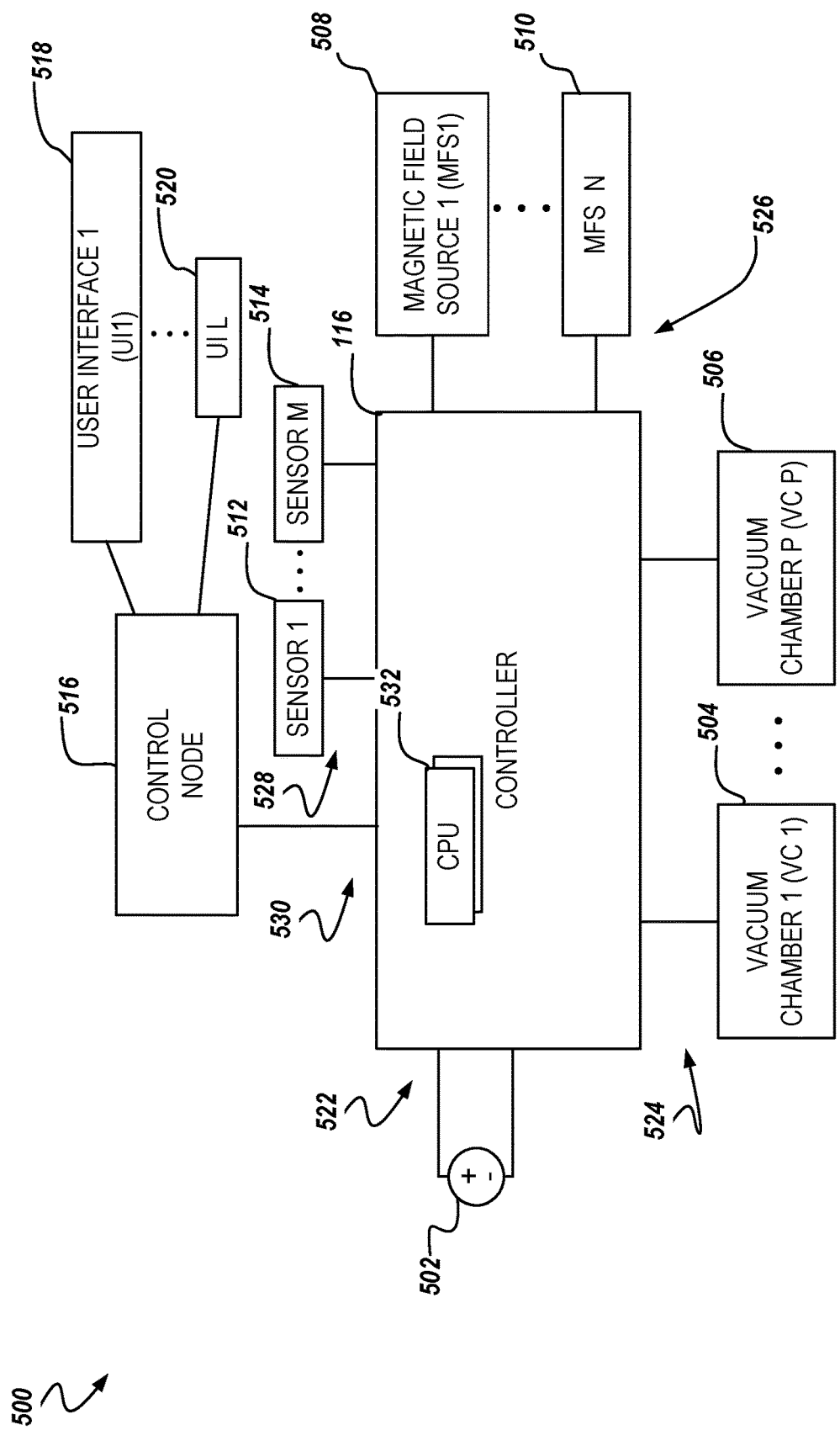
FIG. 5 is a block diagram of a magnetic field controller, which may be used in connection with controlling a magnetic field in a vacuum chamber such as the vacuum chamber of FIG. 1, according to some embodiments.
Figure 6:
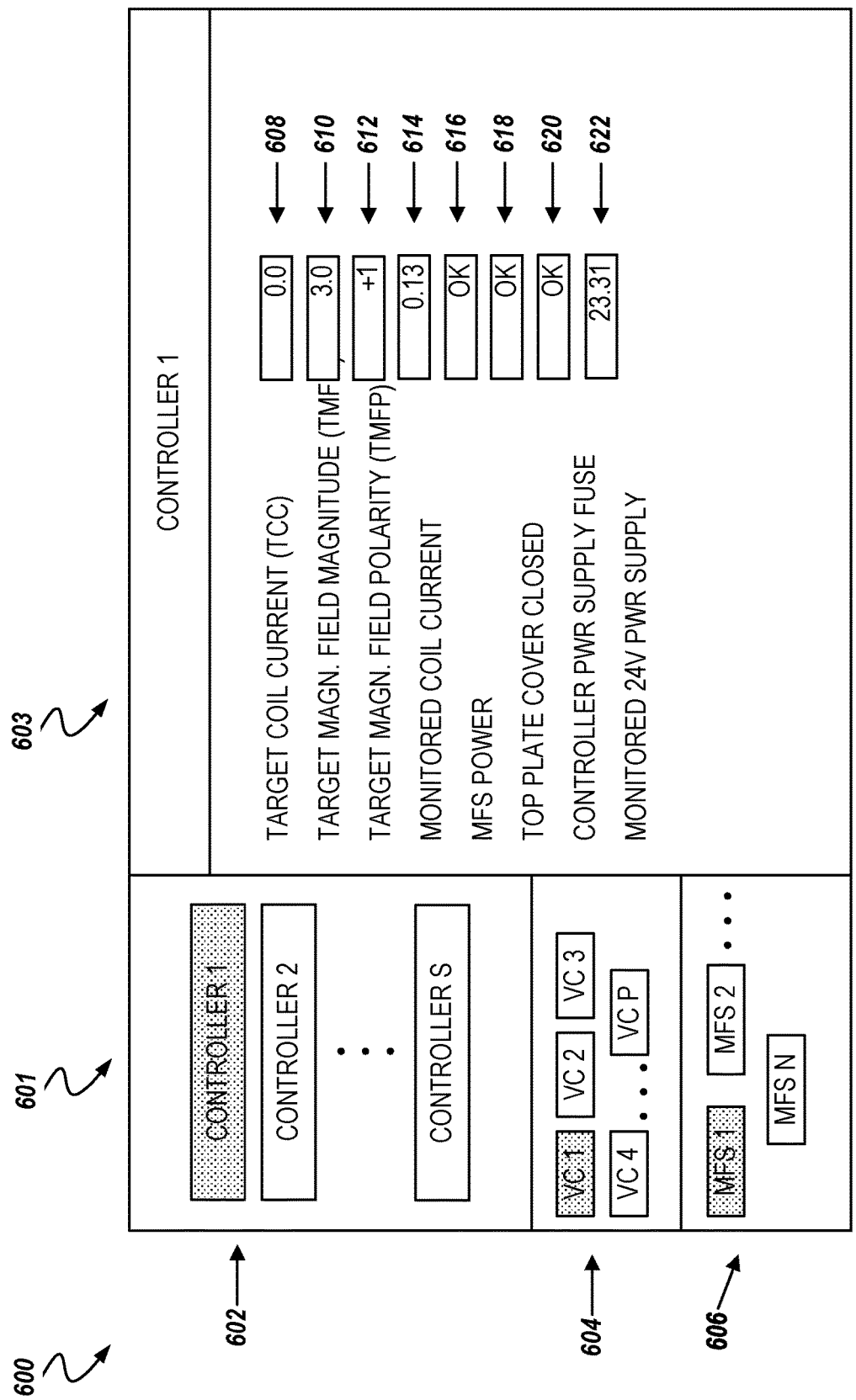
FIG. 6, FIG. 7, and FIG. 8 are example user interfaces that may be used for configuring functionalities or obtaining data associated with the magnetic field controller of FIG. 5, according to some embodiments.
Figure 7:
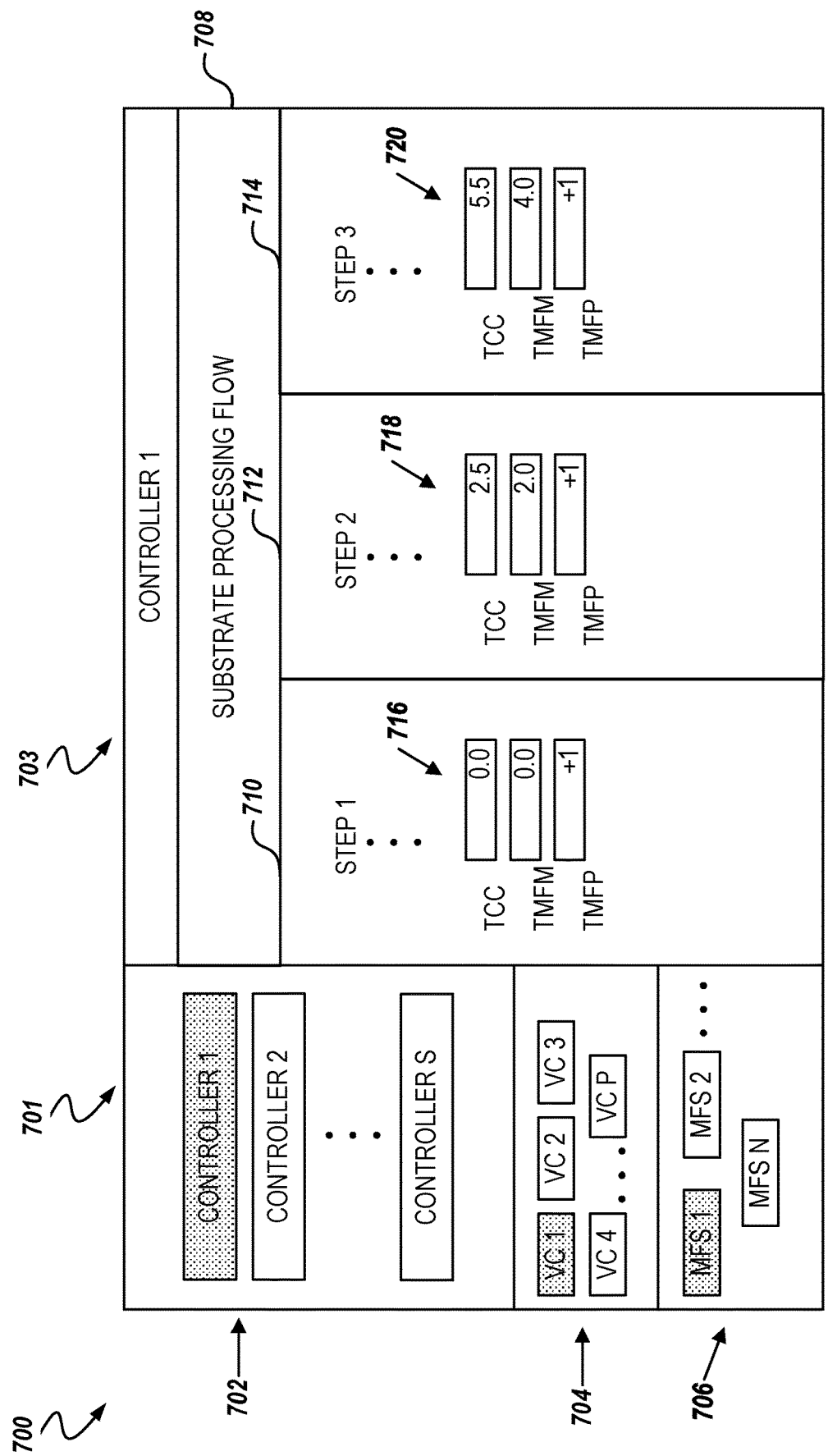
Figure 8:
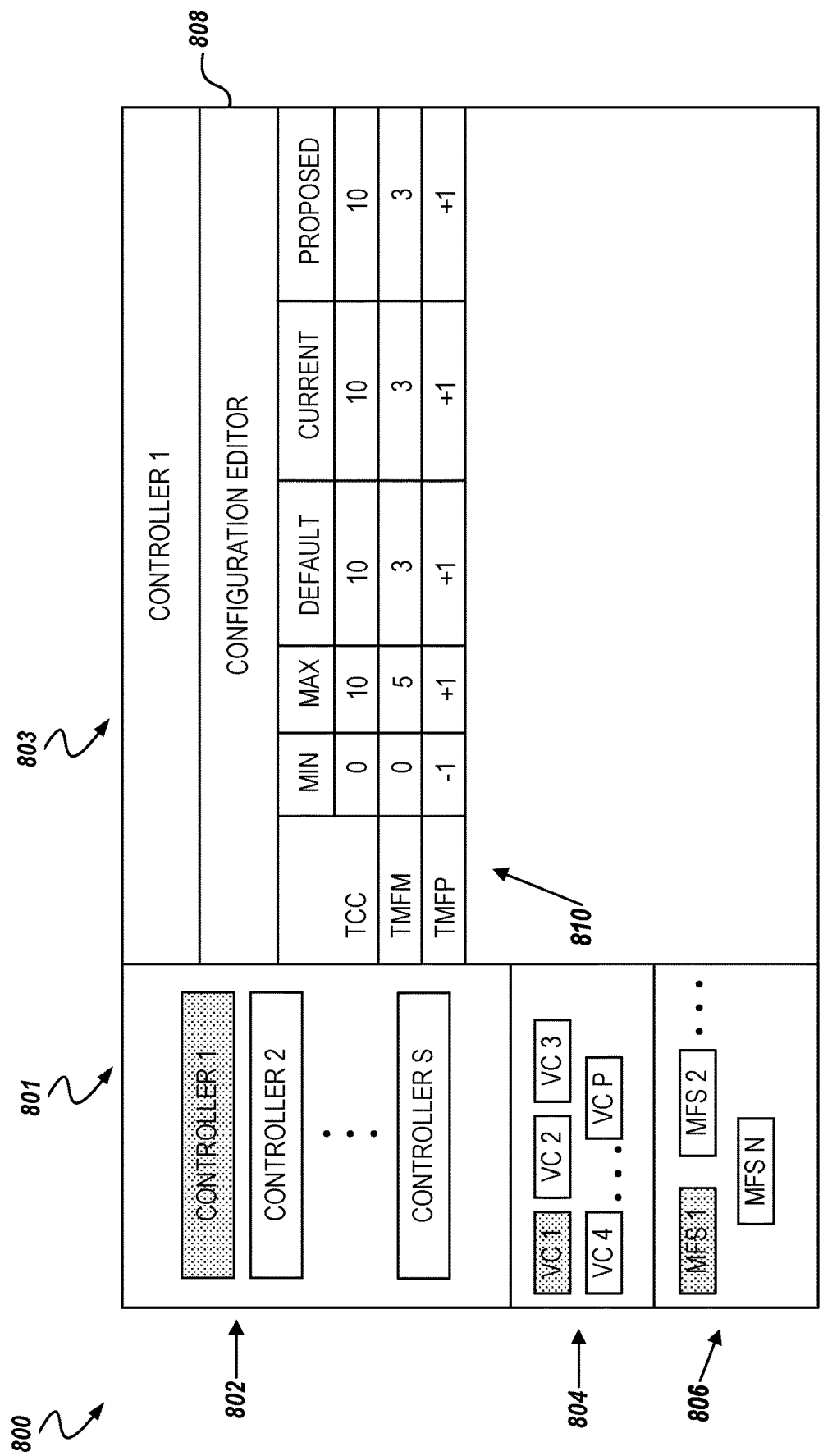
Figure 9:
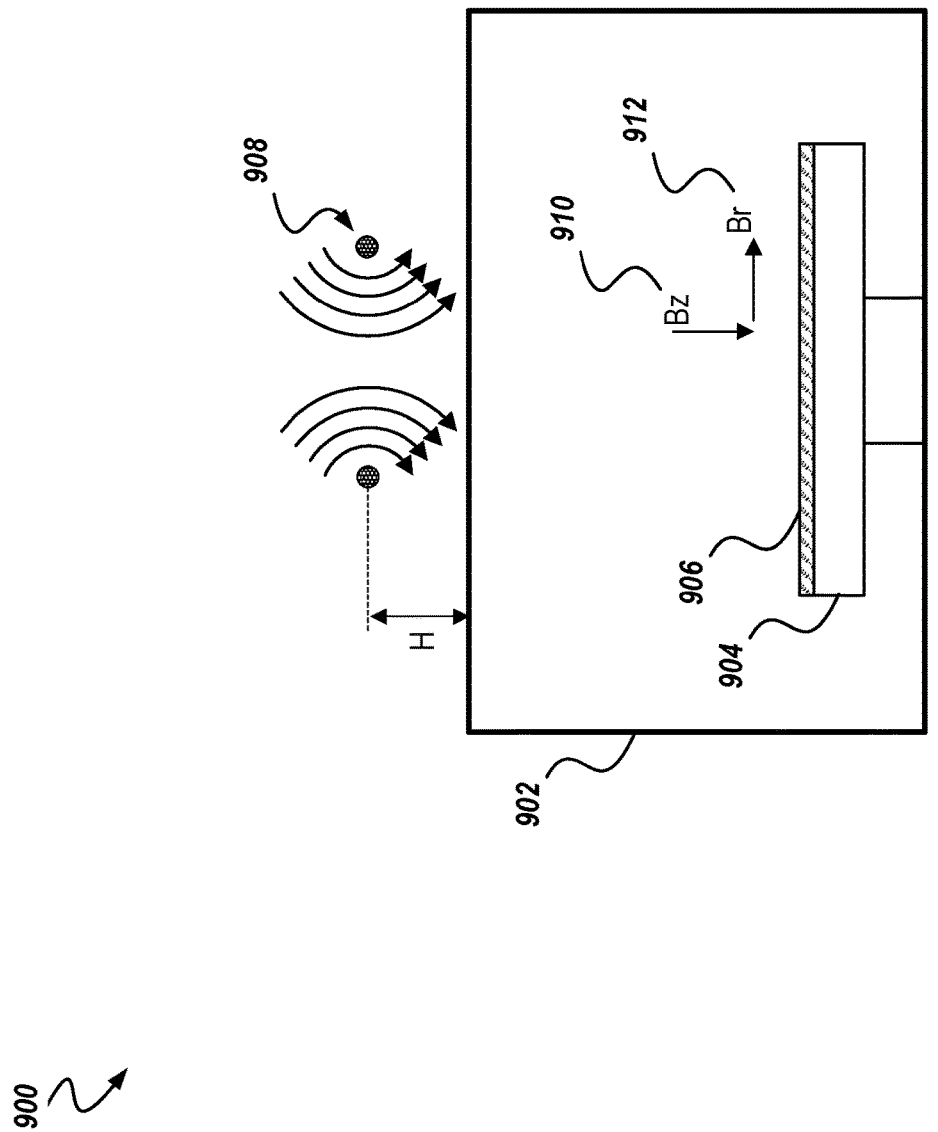
FIG. 9 illustrates a vacuum chamber with a single-coil used as a magnetic field source for axial and radial active magnetic fields, according to some example embodiments.
Figure 10:
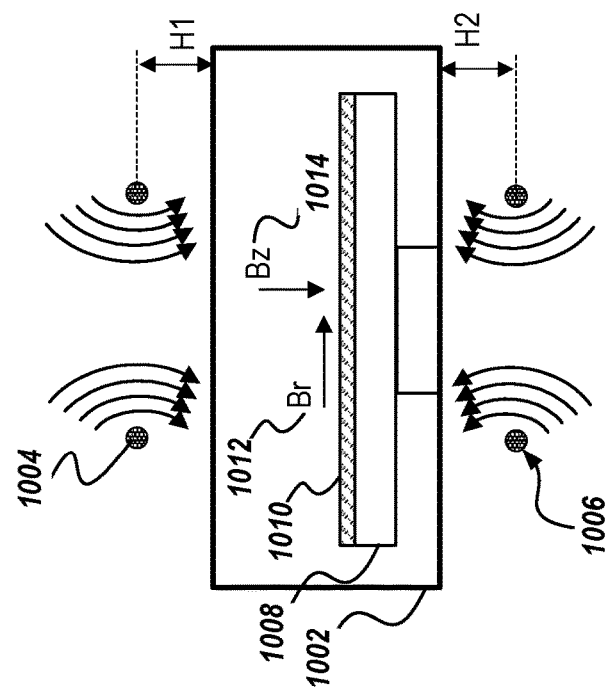
FIG. 10 illustrates a vacuum chamber with two coils used as a combined magnetic field source for axial and radial active magnetic fields, according to some example embodiments.
Figure 11:
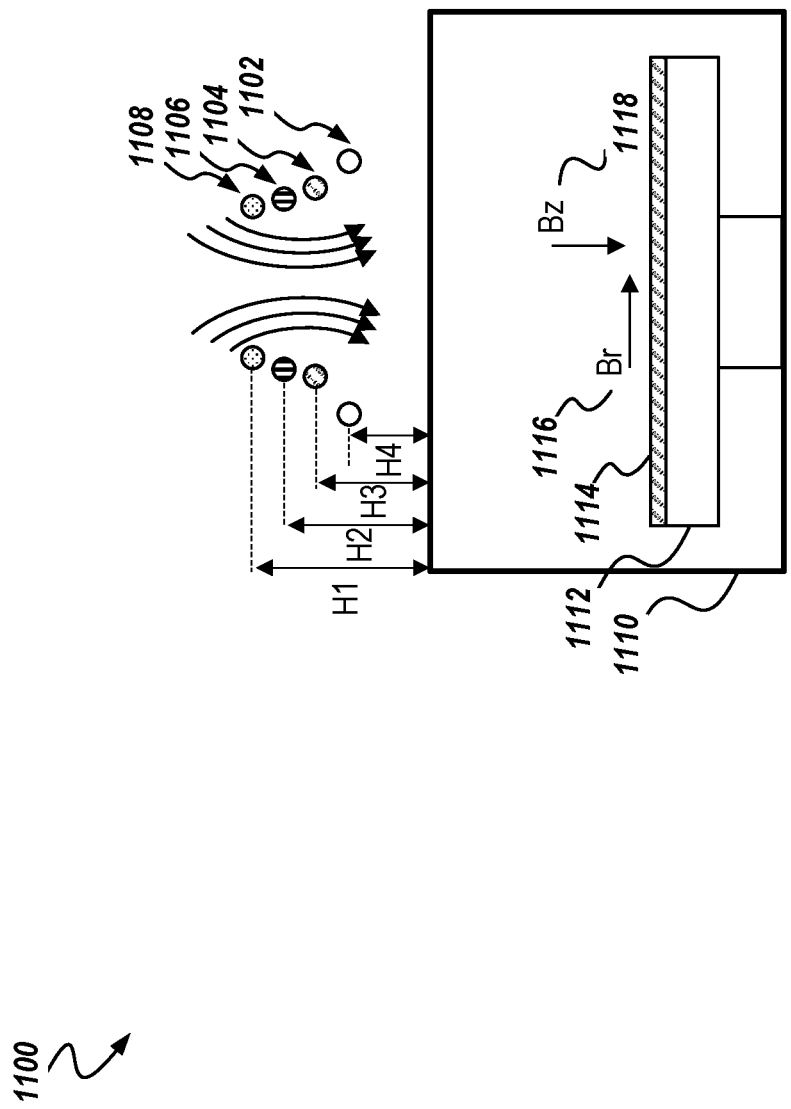
FIG. 11 illustrates a vacuum chamber with four coils used as a combined magnetic field source for axial and radial active magnetic fields, according to some example embodiments.

Different views of the magnetic field source 138 and the support structure 140 are illustrated in FIG. 2-FIG. 4. A more detailed diagram of the MFC 116 is illustrated in FIG. 5. Example user interfaces that may be used for configuring functionalities or obtaining data via the MFC 116 are illustrated in FIG. 6-FIG. 8. Different configurations of one or more magnetic field sources configured or controlled via the MFC 116 are illustrated in FIG. 9-FIG. 11.

Figure 2A:
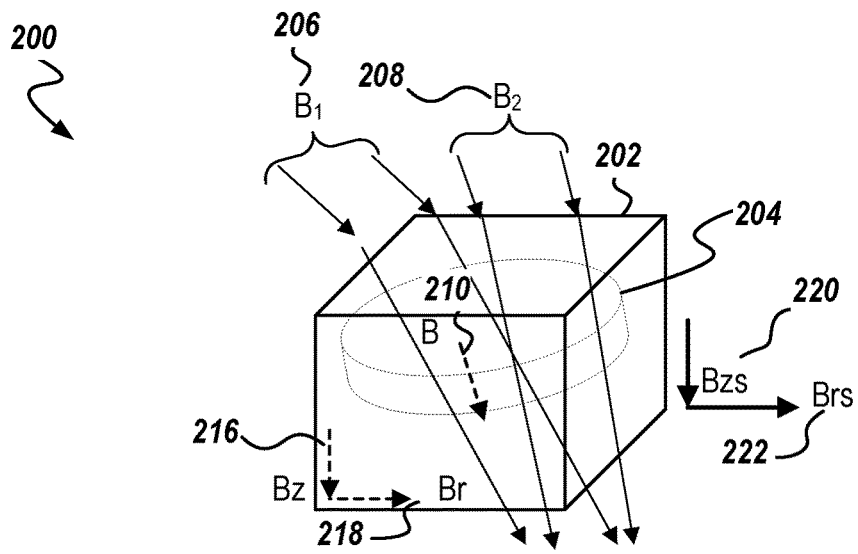
FIG. 2A illustrates a perspective view of a vacuum chamber with active axial and radial magnetic fields within a processing zone, according to some example embodiments.

FIG. 2A illustrates a perspective view 200 of a vacuum chamber 202 with active axial and radial magnetic fields within a processing zone, according to some example embodiments. Referring to FIG. 2A, the vacuum chamber 202 can be exposed to external magnetic fields, such as a first external magnetic field 206 and a second external magnetic field 208, collectively forming a residual magnetic field 210 within a processing zone 204 (e.g., a volume filled with the CCP inside the vacuum chamber 202). The residual magnetic field 210 may be formed by an axial magnetic field 216 (with magnitude Bz) and a radial magnetic field 218 (with magnitude Br).

In an example embodiment, the effects of the residual magnetic field 210 on plasma uniformity across substrate surface within the processing zone 204 can be mitigated by introducing an active magnetic field comprising one or both of an axial active magnetic field 220 and a radial active magnetic field 222, with corresponding magnitudes Bzs and Brs. The resulting magnetic field within the processing zone 204 (e.g., including the residual magnetic field 210 and the active magnetic field comprising the axial active magnetic fields 220 and the radial active magnetic field 222) may be configured via the MFC 116 and using the disclosed techniques to result in greater plasma uniformity across the substrate surface within the processing zone 204. More specifically, multiple magnetic field sources (e.g., as discussed in connection with FIG. 5 and FIG. 9-FIG. 11) may be used to generate one or more active magnetic fields so that target value(s) corresponding to at least one characteristic of the one or more active magnetic fields are achieved.

Figure 2B:
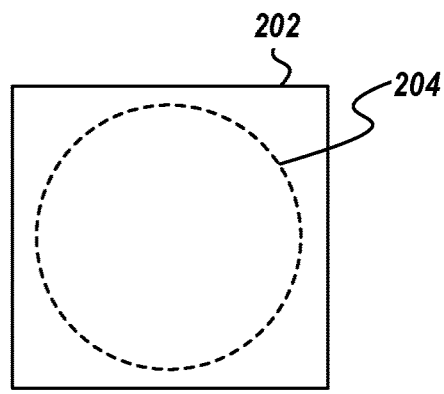
FIG. 2B illustrates a top view of the vacuum chamber of FIG. 2A, according to some example embodiments.
Figure 2C:
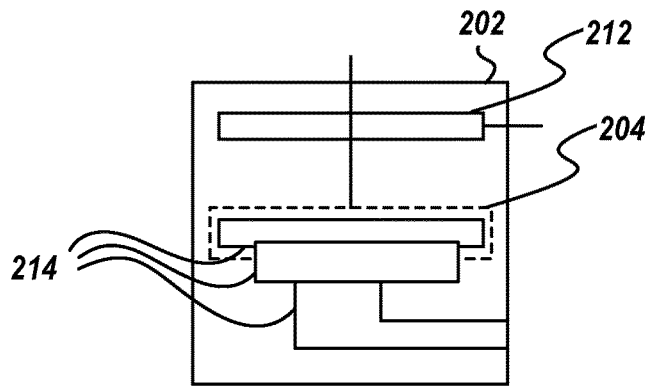
FIG. 2C illustrates a side view of the vacuum chamber of FIG. 2A, according to some example embodiments.

FIG. 2B illustrates a top view of the vacuum chamber 202 of FIG. 2A, according to some example embodiments. FIG. 2C illustrates a side view of the vacuum chamber 202 of FIG. 2A, according to some example embodiments. Referring to FIG. 2C, the vacuum chamber 202 can include a top plate 212 (which can be the same as top plate 136 in FIG. 1) as well as various facilities 214 used in connection with processing a substrate within the processing zone 204 (e.g., RF components and communication links, gas delivery, heaters, high-voltage clamps, substrate delivery mechanisms, etc.). The top plate 212 can include thermo-couplers and auxiliary components to handle the gas flow, power for temperature control, mechanical components associated with gas vacuum functionalities, magnetic field sensors (e.g., sensor 142), etc.

In an example embodiment, the top plate 212 or the facilities 214 may be used for mounting one or more one magnetic field sources (e.g., magnetic field source 138) that can generate one or more active magnetic fields (e.g., an axial active magnetic field and a radial active magnetic field) to counter the residual magnetic field within the vacuum chamber 202 and achieve the desired target values corresponding to at least one characteristic of the one or more active magnetic fields (e.g., desired current through the one or more magnetic field sources, desired polarity, or desired magnitude of the one or more active magnetic fields).

FIG. 3A illustrates a perspective view of a vacuum chamber 302 with a coil used as a magnetic field source for axial and radial magnetic fields, according to some example embodiments. The coil may be a single spiral coil or multiple loops tightly wrapped together to form the single coil. Referring to FIG. 3A, the vacuum chamber 302 (which may be the same as vacuum chamber 100 and vacuum chamber 202) may experience a residual magnetic field 303 measured at location 308 within the processing zone of the vacuum chamber. In some aspects, a magnetic field source 304 (e.g., a single-coil) may be configured to generate an active magnetic field 306 within the vacuum chamber 302. The active magnetic field 306 may include an axial magnetic field 310 with a magnitude Bz and a radial magnetic field 312 with a magnitude Br. In some aspects, the active magnetic field 306 may be configured, periodically monitored, and adjusted by a magnetic field controller (e.g., MFC 116). For example, one or more characteristics of the active magnetic field may be configured (e.g., current, polarity, magnitude, etc. for the magnetic field source 304) to adjust the uniformity of plasma distribution within the vacuum chamber.

In an example embodiment, the residual magnetic field 303 may be detected and measured by a magnetic field sensor (e.g., sensor 142) placed at or near location 308. Additionally, the MFC 116 may use the magnetic field sensor (e.g., sensor 142) for detecting signals representing the active magnetic field 306 (e.g., to determine current, polarity, or magnitude) to perform dynamic adjustments of the active magnetic field. For example, the MFC 116 may adjust a current (e.g., a direct current (DC)) of the coil 304, thereby changing the magnitude of the active magnetic field 306 (and the corresponding magnitudes Bz and Br). In some aspects, the current may be adjusted so that the magnitude of the active magnetic field 306 combined with the magnitude of the residual magnetic field 303 results in the desired magnitude Bz or Br so that a uniform plasma distribution within the vacuum chamber is achieved. In other aspects, the MFC 116 may adjust different characteristics of the magnetic field source (e.g., current, magnitude, polarity, etc.) so that a desired total Bz and/or Br are achieved within the chamber to achieve better uniformity for chamber matching or change plasma uniformity to achieve a desired etch uniformity.

FIG. 3B is a side view of the vacuum chamber 302 of FIG. 3A illustrating mounting options for the magnetic field source 304, according to some example embodiments. Referring to FIG. 3B, in an example embodiment, the magnetic field source 304 (e.g., a coil) may be mounted internally, within the vacuum chamber 302, and in proximity to the processing zone 314. In an example embodiment, the coil 304 may be mounted on a pedestal 318 (e.g., support structure 140 illustrated in FIG. 1 and FIG. 4) secured to the top plate 316 of the vacuum chamber 302 (which can be the same as top plate 136 in FIG. 1). In an example embodiment, the coil 304 may also be mounted to an inside surface of the vacuum chamber 302 (e.g., a top surface as illustrated in FIG. 3B) via connections 320.

In an example embodiment, the coil 304 may be placed outside of the vacuum chamber 302. In an example embodiment, multiple coils may be used as magnetic field sources to generate active magnetic fields (e.g., as illustrated in FIG. 10 and FIG. 11), where each coil may be positioned differently (e.g., inside or outside the vacuum chamber).

FIG. 4 illustrates an example magnetic field source mounted on a top plate of the vacuum chamber of FIG. 1, according to some embodiments. Referring to FIG. 4, the support structure 140 may include a metal housing incorporating the magnetic field source (e.g., coil) 138. In some aspects, the sensor 142 may be mounted via bracket 402 (or another mounting mechanism) to the support structure 140 (e.g., on a surface of the support structure 140).

FIG. 5 is a block diagram 500 of the magnetic field controller 116, which may be used in connection with controlling a magnetic field in a vacuum chamber such as the vacuum chamber 100 of FIG. 1, according to some embodiments. Referring to FIG. 5, MFC 116 comprises suitable circuitry, logic, interfaces, and/or code and is configured to receive sensor data representing one or more active magnetic fields generated by at least one magnetic field source as well as target values corresponding to the one or more active magnetic fields, and adjust a characteristic of the at least one magnetic field source accordingly.

MFC 116 is coupled to a voltage source 502 (e.g., a direct current, or DC, voltage source) via terminal 522. In some embodiments, MFC 116 is configured to control functionalities of vacuum chambers (VCs) 504, . . . , 506 communicatively coupled via terminal 524. Example functionalities of VCs controlled by MFC 116 are discussed in connection with FIG. 1 and may include configuring, monitoring, and adjusting at least one characteristic of magnetic field sources (MFSs) 508, . . . , 510 communicatively coupled to MFC 116 via terminal 526. The MFC 116 may monitor the at least one characteristic of MFSs 508, . . . , 510 via sensors 512, . . . , 514 communicatively coupled to MFC 116 via terminal 528. In some embodiments, one or more of the MFSs 508, . . . , 510 may be disposed at different vacuum chambers (e.g., at least one of the VCs 504, . . . , 506 managed by the MFC 116). In this regard, MFC 116 is configured to manage active magnetic fields associated with multiple MFSs at multiple VCs.

In some embodiments, MFC 116 may receive target values corresponding to at least one characteristic of the one or more active magnetic fields generated by one or more of the MFSs 508, . . . , 510 from the control node 516 (e.g., a computing device or another type of network node) communicatively coupled to the MFC 116 via terminal 530. For example, MFC 116 receives the target values from the control node 516, where the target values are entered via user interfaces (UIs) 518, . . . , 520. Example UIs which may be used with the disclosed functionalities for controlling magnetic fields are described in connection with FIG. 6, FIG. 7, and FIG. 8. Example target values include target coil current (TCC), target magnetic field magnitude (TMFM), and target magnetic field polarity (TMFP) associated with one or more active magnetic fields generated by one or more of the MFSs 508, . . . , 510.

In some embodiments, sensors 512, . . . , 514 may be used to detect and measure residual magnetic fields (such as residual magnetic field 303) as well as magnetic fields in specific directions (e.g., axial and radial magnetic fields). The measured residual magnetic fields may be used for determining the target values corresponding to the at least one characteristic of the one or more active magnetic fields (e.g., determine an initial current for one or more of the MFSs 508, . . . , 510, the initial polarity of the one or more active magnetic fields, or initial magnitude of the one or more active magnetic fields).

In some aspects, signals representing the one or more active magnetic fields (e.g., current associated with the one or more MFSs 508, . . . , 510, magnitude, and polarity of the one or more active magnetic fields) is output (e.g., to a user of the control node 516) via one or more of the UIs 518, . . . , 520 presented at the control node 516.

In operation, the MFC 116 is coupled to the DC voltage source 502 via a first terminal 522, to VCs 504, . . . , 506 via a second terminal 524, to one or more MFSs 508, . . . , 510 via a third terminal 526, to one or more magnetic field sensors 512, . . . , 514 via a fourth terminal 528, and to control node 516 via a fifth terminal 530. Each of the one or more vacuum chambers 504, . . . , 506 includes a processing zone for processing a substrate using plasma. Each of the one or more MFSs 508, . . . , 510 is configured to generate one or more active magnetic fields through the processing zone of at least one of the one or more VCs 504, . . . , 506. The one or more magnetic field sensors 512, . . . , 514 are configured to detect a signal representing the one or more active magnetic fields. The MFC 116 further includes processing circuitry 532 (e.g., one or more central processing units, or CPUs). The processing circuitry 532 is communicatively coupled to the first, second, third, fourth, and fifth terminals. Additionally, the processing circuitry 532 is to detect a target value corresponding to at least one characteristic of the one or more active magnetic fields. The processing circuitry 532 is further to set an initial current through the one or more MFSs 508, . . . , 510, where the initial current corresponds to the target value. The processing circuitry 532 is further to adjust a subsequent current through the one or more MFSs 508, . . . , 510 based on the detected signal representing the one or more active magnetic fields.

In some embodiments, the one or more magnetic field sensors 512, . . . , 514 are configured to periodically detect the signal representing the one or more active magnetic fields. The processing circuitry 532 is further to monitor the subsequent current through the one or more magnetic field sources, and periodically adjust the subsequent current through the one or more MFSs based on the signal representing the one or more active magnetic fields.

In some aspects, the at least one characteristic includes one or more of coil current associated with one or more coils (where the one or more coils configured as the one or more magnetic field sources), magnetic field magnitude of the one or more active magnetic fields, and magnetic field polarity of the one or more active magnetic fields. The processing circuitry 532 is further to adjust the subsequent current through the one or more magnetic field sources based on a difference between the coil current and the initial current corresponding to the target value.

In some embodiments, the detected signal is indicative of the magnetic field magnitude of the one or more active magnetic fields and the processing circuitry 532 is further to adjust the subsequent current through the one or more magnetic field sources based on a difference between the magnetic field magnitude of the one or more active magnetic fields and a magnetic field magnitude corresponding to the target value.

In another embodiment, the detected signal is indicative of the magnetic field polarity of the one or more active magnetic fields and the processing circuitry 532 is further to adjust the subsequent current through the one or more magnetic field sources based on the magnetic field polarity of the one or more active magnetic fields and a magnetic field polarity corresponding to the target value.

FIG. 6, FIG. 7, and FIG. 8 are example user interfaces (UIs) that may be used for configuring functionalities or obtaining data associated with the magnetic field controller 116 of FIG. 5, according to some embodiments. Referring to FIG. 6, UI 600 may be displayed at the control node 516 and is used to provide configuration information in connection with the magnetic field controller (e.g., "Controller 1" which can be MFC 116). UI 600 may include controller identification section 601 and configuration information section 603.

As illustrated in FIG. 6, the controller identification section 601 includes a sub-section 602 identifying available magnetic field controllers (e.g., controllers 1, S) that can be accessed via the control node 516. Sub-section 602 further identifies (e.g., by highlighting) one or more of the available controllers associated with data provided in the configuration information section 603. For example, sub-section 602 in FIG. 6 highlights Controller 1, which is the controller associated with the configuration information section 603.

The controller identification section 601 further includes sub-section 604 listing available vacuum chambers and highlighting one or more of the vacuum chambers accessed by the selected controller (e.g., VC 1 is highlighted in FIG. 6). The controller identification section 601 further includes sub-section 606 listing available MFSs and highlighting one or more of the MFSs accessed by the selected controller (e.g., MFS 1 is highlighted in FIG. 6).

The configuration information section 603 includes the following fields allowing for configuration (e.g., entry by a user of the control node 516) of target values or display of previously entered target values: target control current (TCC) 608 (this parameter indicates a unit current that corresponds to a specific current measured in Amps (A); a parameter 0 is entered corresponding to a current that is turned off; a parameter greater than 0 indicates specific units of current are used; a single unit of current may or may not correspond to 1 A), target magnetic field magnitude (TMFM) 610 (this parameter indicates units of magnetic field strength rather than specific Gauss measurement; a parameter 3.0 is entered corresponding to 3 units of magnetic field strength; a single unit of magnetic field strength may or may not correspond to 1 Gauss), and target magnetic field polarity (TMFP) 612 (a parameter "+1" is entered indicating positive polarity).

The configuration information section 603 may further display additional configuration information associated with the selected controller (Controller 1), such as monitored coil current 614 (e.g., a current state of the coil current), MFS power 616 for the selected MFS (e.g., whether or not the MFS is powered), a top plate cover closed indicator 618 (indicating whether the top plate cover for the top plate housing the MFS is closed and safe to operate), controller power supply fuse status indicator 620, and controller power supply indicator 622 (indicating current voltage supplied to the selected controller). Additional configuration information (including target values, monitored information, or other configuration information) not illustrated in FIG. 6 may also be included in the configuration information section 603.

Referring to FIG. 7, UI 700 may be displayed at the control node 516 and is used to provide configuration information in connection with a substrate processing flow 708 managed by a magnetic field controller (e.g., "Controller 1" which can be MFC 116). UI 700 may include controller identification section 701 and configuration information section 703. The controller identification section 701 includes sub-sections 702, 704, and 706, which may be the same as sub-sections 602, 604, and 606 of FIG. 6.

The substrate processing flow 708 may indicate a plurality of processing steps (e.g., steps 710, 712, and 714) associated with a recipe (or processing flow) for processing a substrate by the selected vacuum chamber (e.g., VC 1 as indicated in sub-section 704). In some embodiments, for each step in the substrate processing flow 708, the controller (e.g., Controller 1, which can be the same as MFC 116) can detect (or retrieve) specific target values entered for that step. For example, a first set of target values 716 (including TCC=0.0, TMFM=0.0, and TMFP="+1") may be entered for step 710, a second set of target values 718 (including TCC=2.5, TMFM=2.0, and TMFP="+1") may be entered for step 712, and a third set of target values 720 (including TCC=5.5, TMFM=4.0, and TMFP="+1") may be entered for step 714. In some embodiments, UI 700 may be used for managing multiple recipes performed at multiple vacuum chambers managed by the selected controller.

Referring to FIG. 8, UI 800 may be displayed at the control node 516 and is used to provide a configuration editor 808 for editing configuration information associated with one or more target values. UI 800 may include controller identification section 801 and configuration information section 803 with the configuration editor 808. The controller identification section 801 includes sub-sections 802, 804, and 806, which may be the same as sub-sections 602, 604, and 606 of FIG. 6.

The configuration editor 808 may include a user interface 810 for specifying a minimum (MIN) value, a maximum (MAX) value, a default value, a current value, and a proposed value for multiple target values used by the controller, including TCC, TMFM, and TMFP. The specific target values illustrated in FIG. 8 are examples and other target values may be configured as well.

FIG. 9 illustrates a diagram 900 of a vacuum chamber 902 (which can be the same as vacuum chamber 100) with a single-coil 908 used as a magnetic field source for axial and radial active magnetic fields, according to some example embodiments. Referring to FIG. 9, the single-coil 908 is used as a source for an axial active magnetic field 910 with a magnitude Bz and a radial active magnetic field 912 with a magnitude Br. One or both of the axial active magnetic field 910 and the radial active magnetic field 912 may be configured, monitored, and controlled by a magnetic field controller such as MFC 116.

During substrate processing of a substrate 906 placed on a pedestal 904, the single-coil 908 is activated resulting in an axial active magnetic field 910 and a radial active magnetic field 912. In an example embodiment, the location of the single-coil 908 (e.g., inside or outside the vacuum chamber 902), the distance H of the single-coil to a top surface of the vacuum chamber (or the distance of the single coil to the substrate 906), the current through the single-coil 908, the polarity of the magnetic field of the single-coil 908, or other characteristics of the single-coil and the magnetic field it generates may be varied by the MFC 116 (e.g., during the setup of the vacuum chamber or dynamically during processing) to achieve a predefined amplitude or polarity of the active magnetic field (or predefined current through the single-coil) for tuning plasma uniformity across the substrate surface in order to achieve desired etch uniformity.

In an example embodiment, to achieve tunability of active magnetic field and more optimal plasma uniformity across a substrate surface in a vacuum chamber, multiple magnetic field sources (e.g., at least two magnetic field sources) may be used to generate axial and radial magnetic fields within the vacuum chamber, where processing characteristics of the magnetic field sources may be adjusted individually by the MFC 116 (e.g., at set up time or dynamically, during the substrate processing). Example embodiments using multiple magnetic field sources are discussed in connection with FIG. 10 and FIG. 11.

FIG. 10 illustrates a diagram 1000 of a vacuum chamber 1002 (which can be the same as vacuum chamber 100) with two magnetic field sources such as coils (e.g., coils 1004 and 1006) used as a combined magnetic field source for axial and radial active magnetic fields, according to some example embodiments. Referring to FIG. 10, the coils 1004 and 1006 are used as a combined source for an axial active magnetic field 1014 with a magnitude Bz and a radial active magnetic field 1012 with a magnitude Br.

As illustrated in FIG. 10, the substrate 1010 is placed on a pedestal 1008 within the vacuum chamber 1002. Coil 1004 is placed at a distance of H1 from the top surface of the vacuum chamber 1002 and coil 1006 is placed at a distance of H2 at the bottom surface of the vacuum chamber 1002. During substrate processing of a substrate 1010 placed on the pedestal 1008, the coils 1004 and 1006 are activated resulting in the axial active magnetic field 1014 and the radial active magnetic field 1012.

Even though coils 1004 and 1006 are illustrated as both being outside the vacuum chamber 1002, the disclosure is not limited in this regard and any of the coils 1004 and 1006 may be disposed inside or outside of the vacuum chamber 1002. Additionally, at least one characteristic of the coils 1004 and 1006 may be configured (e.g., based on one or more target values), monitored (via one or more sensors), and adjusted (e.g., based on a difference between the target values and sensor data or signals representing a current state of the at least one characteristic) by the MFC 116. In some aspects, the MFC 116 may perform the monitoring and adjustment functionalities (including adjusting the distances H1 and H2) dynamically, while the substrate is being processed within the vacuum chamber to optimize plasma distribution and etch uniformity.

In an example embodiment, the location of the coils 1006 and 1004 (e.g., inside or outside the vacuum chamber 1002), the distances H1 and H2 to the corresponding top and bottom surfaces of the vacuum chamber (or the respective distances of the coils 1004 and 1006 to the substrate 1010), the current through each of the coils 1004 and 1006 (or any other processing characteristic of the coils including polarity and magnitude of the magnetic fields they generate) may be varied individually for each coil (e.g., by the MFC 116 during the setup of the vacuum chamber or dynamically during processing) to achieve different active magnetic fields for optimal tuning plasma uniformity across the substrate surface to achieve a desired etch uniformity. Additionally, coils 1004 and 1006 may be of the same or different diameter, and placed in the same orientation (e.g., as illustrated in FIG. 10) or placed in a different orientation in relation to each other.

FIG. 11 illustrates a diagram 1100 of a vacuum chamber 1110 (which can be the same as vacuum chamber 100) with four magnetic field sources such as coils (e.g., coils 1102, 1104, 1106, and 1108) used as a combined magnetic field source for axial and radial active magnetic fields, according to some example embodiments. Referring to FIG. 11, the coils 1102-1108 are used as a combined source for an axial active magnetic field 1118 with a magnitude Bz and a radial active magnetic field 1116 with a magnitude Br.

As illustrated in FIG. 11, the substrate 1114 is placed on a pedestal 1112 within the vacuum chamber 1110. Coils 1108, 1106, 1104, and 1102 are placed at corresponding distances H1, H2, H3, and H4 from the top surface of the vacuum chamber 1110. Even though coils 1102-1108 are illustrated as being outside the vacuum chamber 1110, the disclosure is not limited in this regard, and any of the coils 1102-1108 may be disposed inside or outside of the vacuum chamber 1110 (while remaining parallel to each other and the substrate 1114).

In an example embodiment and as illustrated in FIG. 11, coils 1102-1108 have different diameters. However, the disclosure is not limited in this regard, and two or more of the coils 1102-1108 may have the same diameter. Additionally, even though FIG. 11 illustrates four separate coils with different diameters and disposed in a stacked configuration, the disclosure is not limited in this regard and the MFC 116 may be configured to control a different number of magnetic field sources disposed in different configurations in proximity to one or more surfaces of the vacuum chamber.

During substrate processing of a substrate 1114 placed on the pedestal 1112, the coils 1102-1108 are activated resulting in the axial active magnetic field 1118 and the radial active magnetic field 1116.

In an example embodiment, the location of the coils 1102-1108 (e.g., inside or outside the vacuum chamber 1110), the distances H1-H4 to the top surface of the vacuum chamber (or the respective distances of the coils 1102-1108 to the substrate 1114), the current through each of the coils 1102-1108 (or any other processing characteristic of the coils such as polarity and magnitude of the magnetic fields they generate) may be varied individually for each coil (e.g., by the MFC 116 during the setup of the vacuum chamber or dynamically during processing) to achieve different active magnetic fields based on pre-defined target values and to achieve optimal tuning plasma uniformity across the substrate surface.

Figure 12:
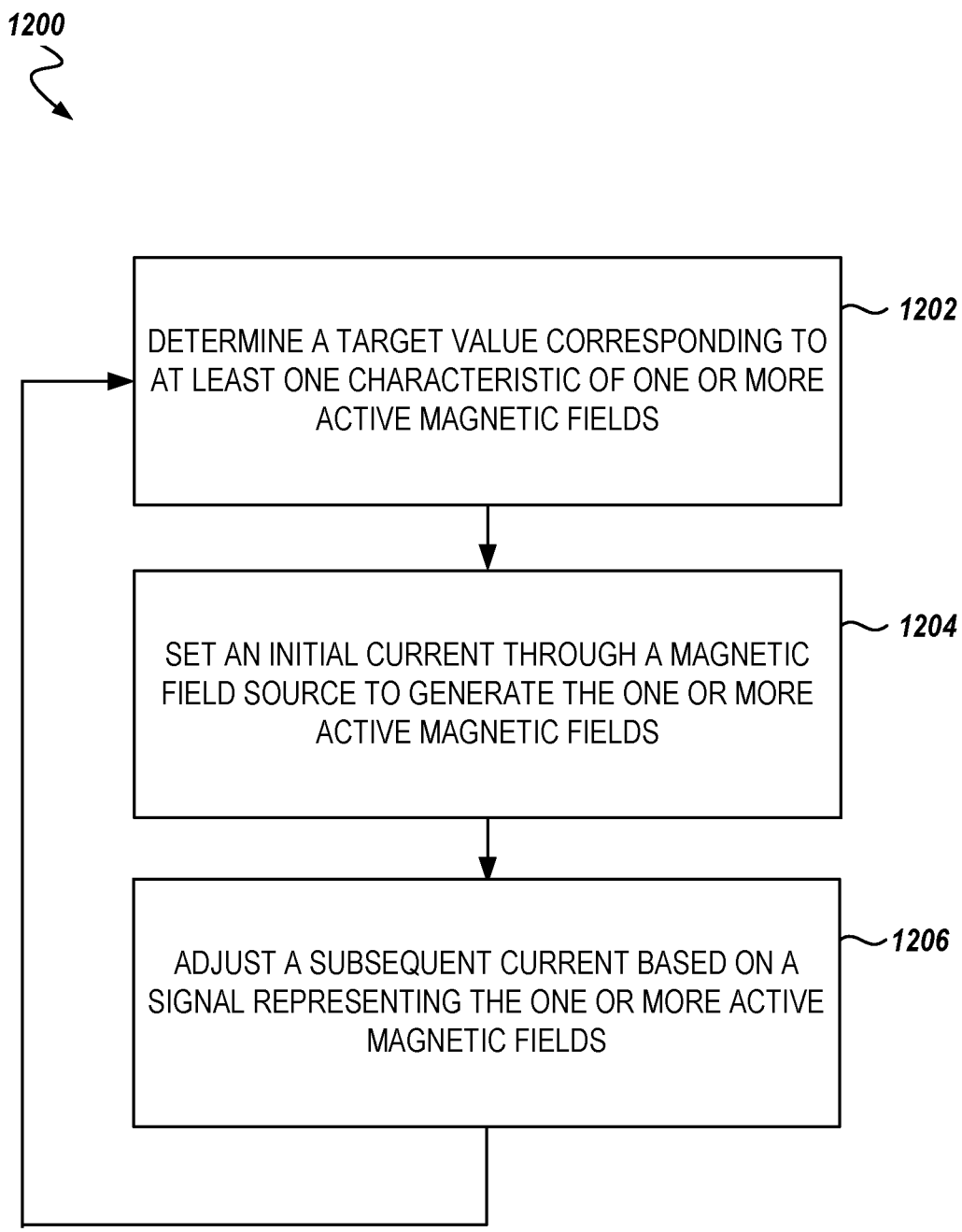
FIG. 12 is a flowchart of a method of controlling a magnetic field in a vacuum chamber, according to some example embodiments.

FIG. 12 is a flowchart of a method 1200 for controlling a magnetic field in a vacuum chamber, according to some example embodiments. Method 1200 includes operations 1202, 1204, and 1206, which may be performed by a magnetic field controller such as magnetic field controller 116 of FIG. 1 and FIG. 5 or processor 1302 of FIG. 13. In some embodiments, processor 1302 of FIG. 13 may be the same as processing circuitry 532. Referring to FIG. 12, at operation 1202, a target value corresponding to at least one characteristic of one or more active magnetic fields through a processing zone of the vacuum chamber is determined. For example, MFC 116 determines (e.g., receives or retrieves from memory) one or more of the target values 608-612 provided or specified (e.g., by a user) via the UI 600.

At operation 1204, MFC 116 sets an initial current through at least one magnetic field source to generate the one or more active magnetic fields, the initial current corresponding to the target value. For example, MFC 116 determines an initial current for at least one of the MFSs 508, . . . , 510 based on the target value (e.g., based on the TCC 608) and sets the determined initial current for at least one of the MFSs 508, . . . , 510.

At operation 1206, MFC 116 adjusts a subsequent current through the at least one magnetic field source based on a signal representing one or more active magnetic fields, the signal detected via a magnetic field sensor associated with the at least one magnetic field source. For example, the signal detected via the magnetic field sensor may be indicative current of the activated at least one MFS, the polarity of the generated active magnetic field, or the magnitude of the generated active magnetic field measured. For example, MFC 116 measures the subsequent current via one or more of the sensors 512, . . . , 514 after a pre-determined time has passed from setting the initial current. The MFC 116 may determine an adjustment (e.g., to the MFS current, the active magnetic field polarity, or magnitude) based on a difference between the target value and the detected signal at the time the subsequent current is measured.

Magnetic fields may change (drift) during wafer processing for various reasons (e.g., component temperature changes, surrounding magnetic field changes, etc.). To maintain the desired field throughout a wafer process, from wafer to wafer, and from chamber to chamber, method 1200 further implements an active feedback loop in the MFC to control the at least one MFS. FIG. 12 further illustrates a control loop mechanism where information from operation 1206 is fed back to operation 1202. More specifically the subsequent current through the at least one magnetic field source is adjusted based on a difference of currents, such as between the signal (e.g., coil current) detected by the magnetic field sensor and the initial current corresponding to the target value. The determined difference of currents may be fed back and used again at operation 1202, where the target value is adjusted based on the determined difference of currents, and the remaining operations 1204-1206 of method 1200 may be repeated. In some aspects, the at least one characteristic includes one or more of the following: coil current associated with at least one coil (where the at least one coil is configured as the at least one magnetic field source), magnetic field magnitude of the one or more active magnetic fields, and magnetic field polarity of the one or more active magnetic fields.

In some embodiments, the MFC 116 is configured to adjust the subsequent current through the at least one magnetic field source based on a difference between the coil current and the initial current corresponding to the target value.

In a different embodiment, the signal is indicative of the magnetic field magnitude of the one or more active magnetic fields. The MFC 116 is configured to adjust the subsequent current through the at least one magnetic field source based on a difference between the magnetic field magnitude of the one or more active magnetic fields and a magnitude field magnitude corresponding to the target value.

In some aspects, the signal is indicative of the magnetic field polarity of the one or more active magnetic fields. The MFC 116 is configured to adjust the subsequent current through the at least one magnetic field source based on the magnetic field polarity of the one or more active magnetic fields and a magnetic field polarity corresponding to the target value.

In some embodiments, the MFC 116 is further configured to periodically detect the signal representing the one or more active magnetic fields, monitor the subsequent current through the at least one magnetic field source, and periodically adjust the subsequent current through the at least one magnetic field source based on the signal representing the one or more active magnetic fields.

Figure 13:
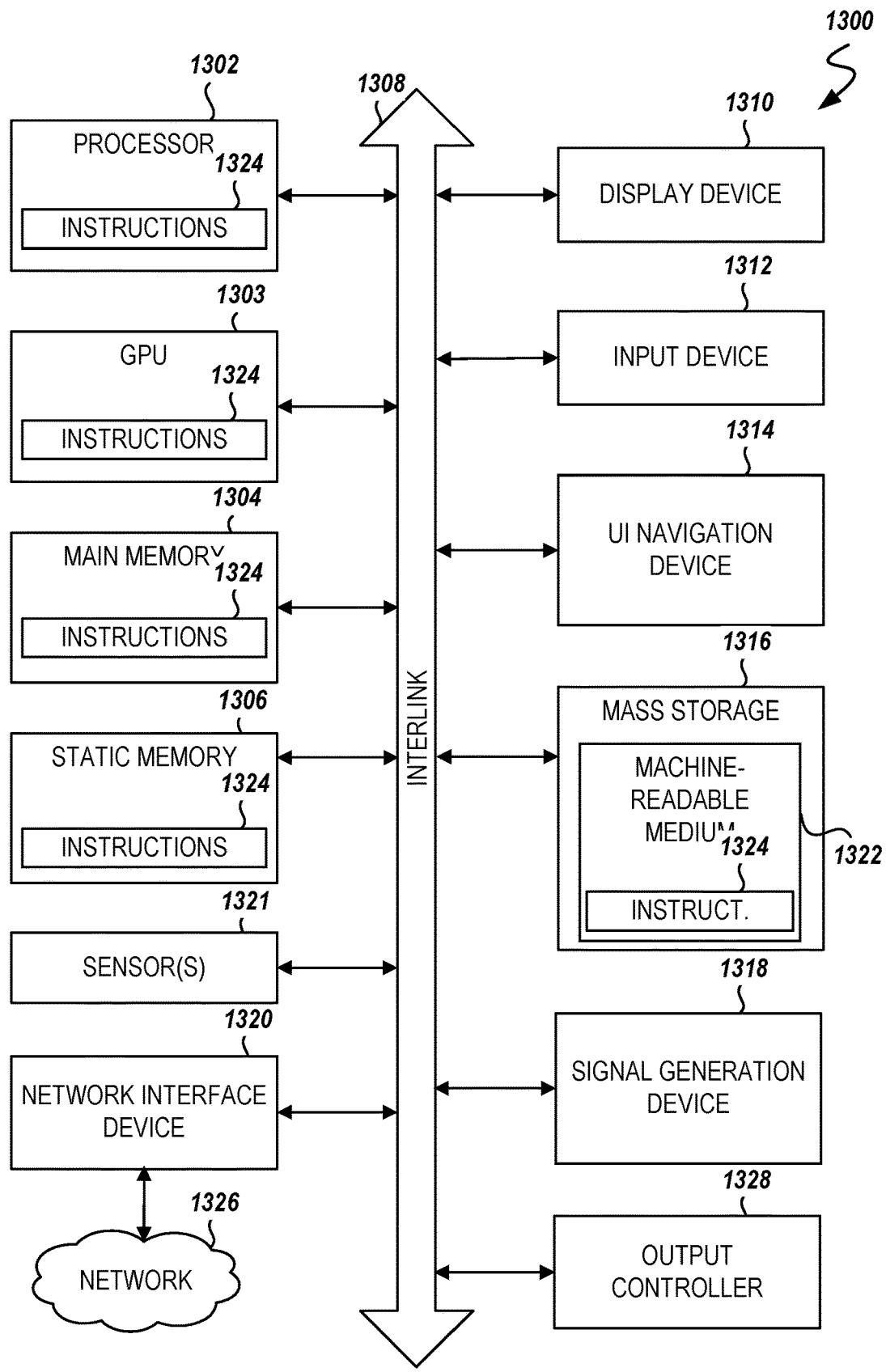
FIG. 13 is a block diagram illustrating an example of a machine upon which one or more example method embodiments may be implemented, or by which one or more example embodiments may be controlled.

FIG. 13 is a block diagram illustrating an example of a machine 1300 upon or by which one or more example process embodiments described herein may be implemented or controlled. In alternative embodiments, the machine 1300 may operate as a standalone device or may be connected (e.g., networked) to other machines. In a networked deployment, the machine 1300 may operate in the capacity of a server machine, a client machine, or both in server-client network environments. In an example, the machine 1300 may act as a peer machine in a peer-to-peer (P2P) (or other distributed) network environment. Further, while only a single machine 1300 is illustrated, the term "machine" shall also be taken to include any collection of machines that individually or jointly execute a set (or multiple sets) of instructions to perform any one or more of the methodologies discussed herein, such as via cloud computing, software as a service (SaaS), or other computer cluster configurations.

Examples, as described herein, may include, or may operate by, logic, several components, or mechanisms. Circuitry is a collection of circuits implemented in tangible entities that include hardware (e.g., simple circuits, gates, logic). Circuitry membership may be flexible over time and underlying hardware variability. Circuitries include members that may, alone or in combination, perform specified operations when operating. In an example, the hardware of the circuitry may be immutably designed to carry out a specific operation (e.g., hardwired). In an example, the hardware of the circuitry may include variably connected physical components (e.g., execution units, transistors, simple circuits) including a computer-readable medium physically modified (e.g., magnetically, electrically, by the moveable placement of invariant massed particles) to encode instructions of the specific operation. In connecting the physical components, the underlying electrical properties of a hardware constituent are changed (for example, from an insulator to a conductor or vice versa). The instructions enable embedded hardware (e.g., the execution units or a loading mechanism) to create members of the circuitry in hardware via the variable connections to carry out portions of the specific operation when in operation. Accordingly, the computer-readable medium is communicatively coupled to the other components of the circuitry when the device is operating. In some aspects, any of the physical components may be used in more than one member of more than one circuitry. For example, under operation, execution units may be used in a first circuit of a first circuitry at one point in time and reused by a second circuit in the first circuitry, or by a third circuit in a second circuitry, at a different time.

The machine (e.g., computer system) 1300 may include a hardware processor 1302 (e.g., a central processing unit (CPU), a hardware processor core, or any combination thereof), a graphics processing unit (GPU) 1303, a main memory 1304, and a static memory 1306, some or all of which may communicate with each other via an interlink (e.g., bus) 1308. The machine 1300 may further include a display device 1310, an alphanumeric input device 1312 (e.g., a keyboard), and a user interface (UI) navigation device 1314 (e.g., a mouse). In an example, the display device 1310, alphanumeric input device 1312, and UI navigation device 1314 may be a touch screen display. The machine 1300 may additionally include a mass storage device (e.g., drive unit) 1316, a signal generation device 1318 (e.g., a speaker), a network interface device 1320, and one or more sensors 1321, such as a Global Positioning System (GPS) sensor, compass, accelerometer, or another sensor. The machine 1300 may include an output controller 1328, such as a serial (e.g., universal serial bus (USB)), parallel, or other wired or wireless (e.g., infrared (IR), near field communication (NFC)) connection to communicate with or control one or more peripheral devices (e.g., a printer, card reader).

In an example embodiment, the hardware processor 1302 may perform the functionalities of the magnetic field controller 116 discussed hereinabove, in connection with at least FIG. 1-FIG. 12.

The mass storage device 1316 may include a machine-readable medium 1322 on which is stored one or more sets of data structures or instructions 1324 (e.g., software) embodying or utilized by any one or more of the techniques or functions described herein. The instructions 1324 may also reside, completely or at least partially, within the main memory 1304, within the static memory 1306, within the hardware processor 1302, or within the GPU 1303 during execution thereof by the machine 1300. In an example, one or any combination of the hardware processor 1302, the GPU 1303, the main memory 1304, the static memory 1306, or the mass storage device 1316 may constitute machine-readable media.

While the machine-readable medium 1322 is illustrated as a single medium, the term "machine-readable medium" may include a single medium or multiple media, (e.g., a centralized or distributed database, and/or associated caches and servers) configured to store the one or more instructions 1324.

The term "machine-readable medium" may include any medium that is capable of storing, encoding, or carrying instructions 1324 for execution by the machine 1300 and that cause the machine 1300 to perform any one or more of the techniques of the present disclosure, or that is capable of storing, encoding, or carrying data structures used by or associated with such instructions 1324. Non-limiting machine-readable medium examples may include solid-state memories and optical and magnetic media. In an example, a massed machine-readable medium comprises a machine-readable medium 1322 with a plurality of particles having invariant (e.g., rest) mass. Accordingly, massed machine-readable media are not transitory propagating signals. Specific examples of massed machine-readable media may include non-volatile memory, such as semiconductor memory devices (e.g., Electrically Programmable Read-Only Memory (EPROM), Electrically Erasable Programmable Read-Only Memory (EEPROM)) and flash memory devices; magnetic disks, such as internal hard disks and removable disks; magneto-optical disks; and CD-ROM and DVD-ROM disks.

The instructions 1324 may further be transmitted or received over a communications network 1326 using a transmission medium via the network interface device 1320.

Implementation of the preceding techniques may be accomplished through any number of specifications, configurations, or example deployments of hardware and software. It should be understood that the functional units or capabilities described in this specification may have been referred to or labeled as components or modules, to more particularly emphasize their implementation independence. Such components may be embodied by any number of software or hardware forms. For example, a component or module may be implemented as a hardware circuit comprising custom very-large-scale integration (VLSI) circuits or gate arrays, off-the-shelf semiconductors such as logic chips, transistors, or other discrete components. A component or module may also be implemented in programmable hardware devices such as field-programmable gate arrays, programmable array logic, programmable logic devices, or the like. Components or modules may also be implemented in software for execution by various types of processors. An identified component or module of executable code may, for instance, comprise one or more physical or logical blocks of computer instructions, which may, for instance, be organized as an object, procedure, or function. Nevertheless, the executables of an identified component or module need not be physically located together but may comprise disparate instructions stored in different locations which, when joined logically together, comprise the component or module and achieve the stated purpose for the component or module.

Indeed, a component or module of executable code may be a single instruction, or many instructions, and may even be distributed over several different code segments, among different programs, and across several memory devices or processing systems. In particular, some aspects of the described process (such as code rewriting and code analysis) may take place on a different processing system (e.g., in a computer in a data center), than that in which the code is deployed (e.g., in a computer embedded in a sensor or robot). Similarly, operational data may be identified and illustrated herein within components or modules and may be embodied in any suitable form and organized within any suitable type of data structure. The operational data may be collected as a single data set or may be distributed over different locations including over different storage devices, and may exist, at least partially, merely as electronic signals on a system or network. The components or modules may be passive or active, including agents operable to perform desired functions.

Additional Notes & Examples

Example 1 is a substrate processing apparatus, comprising: a vacuum chamber including a processing zone for processing a substrate using plasma; at least one magnetic field source configured to generate one or more active magnetic fields through the processing zone of the vacuum chamber; a magnetic field sensor configured to detect a signal representing the one or more active magnetic fields; and a controller coupled to the magnetic field sensor and the at least one magnetic field source, wherein to perform adjustment of the at least one magnetic field source, the controller is configured to determine a target value corresponding to at least one characteristic of the one or more active magnetic fields; set an initial current through the at least one magnetic field source, the initial current corresponding to the target value; and adjust a subsequent current through the at least one magnetic field source based on the detected signal representing the one or more active magnetic fields.

In Example 2, the subject matter of Example 1 includes, wherein the at least one characteristic comprises one or more of: coil current associated with at least one coil, the at least one coil configured as the at least one magnetic field source; magnetic field magnitude of the one or more active magnetic fields; and magnetic field polarity of the one or more active magnetic fields.

In Example 3, the subject matter of Example 2 includes, wherein the controller is further configured to adjust the subsequent current through the at least one magnetic field source based on a difference between the coil current and the initial current corresponding to the target value; update the target value based on the difference; and repeat the adjustment of the at least one magnetic field source based on the updated target value.

In Example 4, the subject matter of Examples 2-3 includes, wherein the detected signal is indicative of the magnetic field magnitude of the one or more active magnetic fields, and the controller is further configured to adjust the subsequent current through the at least one magnetic field source based on a difference between the magnetic field magnitude of the one or more active magnetic fields and a magnitude field magnitude corresponding to the target value.

In Example 5, the subject matter of Examples 2-4 includes, wherein the detected signal is indicative of the magnetic field polarity of the one or more active magnetic fields and the controller is further configured to adjust the subsequent current through the at least one magnetic field source based on the magnetic field polarity of the one or more active magnetic fields and a magnetic field polarity corresponding to the target value.

In Example 6, the subject matter of Examples 1-5 includes, wherein the controller is further configured to receive the target value as a user input using at least one user interface.

In Example 7, the subject matter of Examples 1-6 includes, wherein the at least one magnetic field source comprises at least one coil of a pre-determined diameter, the at least one coil being substantially parallel to a surface of the substrate when the substrate is positioned in the vacuum chamber.

In Example 8, the subject matter of Examples 1-7 includes, wherein the at least one magnetic field source comprises at least two coils, the at least two coils having different diameters.

In Example 9, the subject matter of Example 8 includes, wherein a first coil of the at least two coils is substantially parallel to a surface of the substrate when the substrate is positioned in the vacuum chamber.

In Example 10, the subject matter of Example 9 includes, wherein a second coil of the at least two coils is substantially orthogonal to a surface of the substrate when the substrate is positioned in the vacuum chamber.

In Example 11, the subject matter of Examples 1-10 includes, wherein one or both of the magnetic field sensor and the at least one magnetic field source are mounted externally to the vacuum chamber.

In Example 12, the subject matter of Examples 1-11 includes, wherein the magnetic field sensor is configured to periodically detect the signal representing the one or more active magnetic fields, and wherein the controller is further configured to periodically adjust the subsequent current through the at least one magnetic field source based on the signal representing the one or more active magnetic fields.

Example 13 is a magnetic field controller, comprising: a first terminal coupled to a direct current (DC) voltage source; a second terminal communicatively coupled to one or more vacuum chambers, each of the one or more vacuum chambers including a processing zone for processing a substrate using plasma; a third terminal communicatively coupled to one or more magnetic field sources, each of the one or more magnetic field sources configured to generate one or more active magnetic fields through the processing zone of at least one of the one or more vacuum chambers; a fourth terminal communicatively coupled to one or more magnetic field sensors configured to detect a signal representing the one or more active magnetic fields; and processing circuitry communicatively coupled to the first, second, third, and fourth terminals, wherein to perform adjustment of the one or more magnetic field sources, the processing circuitry is configured to: determine a target value corresponding to at least one characteristic of the one or more active magnetic fields; set an initial current through the one or more magnetic field sources, the initial current corresponding to the target value; and adjust a subsequent current through the one or more magnetic field sources based on the detected signal representing the one or more active magnetic fields.

In Example 14, the subject matter of Example 13 includes, wherein the one or more magnetic field sensors are configured to periodically detect the signal representing the one or more active magnetic fields, and wherein the processing circuitry is further configured to periodically adjust the subsequent current through the one or more magnetic field sources based on the signal representing the one or more active magnetic fields.

In Example 15, the subject matter of Examples 13-14 includes, wherein the at least one characteristic comprises one or more of: coil current associated with one or more coils, the one or more coils configured as the one or more magnetic field sources; magnetic field magnitude of the one or more active magnetic fields; and magnetic field polarity of the one or more active magnetic fields.

In Example 16, the subject matter of Example 15 includes, wherein the processing circuitry is further configured to adjust the subsequent current through the one or more magnetic field sources based on a difference between the coil current and the initial current corresponding to the target value; update the target value based on the difference; and repeat the adjustment of the one or more magnetic field sources based on the updated target value.

In Example 17, the subject matter of Examples 15-16 includes, wherein the detected signal is indicative of the magnetic field magnitude of the one or more active magnetic fields and the processing circuitry is further configured to adjust the subsequent current through the one or more magnetic field sources based on a difference between the magnetic field magnitude of the one or more active magnetic fields and a magnetic field magnitude corresponding to the target value.

In Example 18, the subject matter of Examples 15-17 includes, wherein the detected signal is indicative of the magnetic field polarity of the one or more active magnetic fields and the processing circuitry is further configured to adjust the subsequent current through the one or more magnetic field sources based on the magnetic field polarity of the one or more active magnetic fields and a magnetic field polarity corresponding to the target value.

Example 19 is a method of controlling a magnetic field in a vacuum chamber, the method comprising: determining a target value corresponding to at least one characteristic of one or more active magnetic fields through a processing zone of the vacuum chamber; setting an initial current through at least one magnetic field source to generate the one or more active magnetic fields, the initial current corresponding to the target value; and adjusting a subsequent current through the at least one magnetic field source based on a signal representing the one or more active magnetic fields, the signal detected via a magnetic field sensor associated with the at least one magnetic field source.

In Example 20, the subject matter of Example 19 includes, wherein the at least one characteristic comprises one or more of: coil current associated with at least one coil, the at least one coil configured as the at least one magnetic field source; magnetic field magnitude of the one or more active magnetic fields; and magnetic field polarity of the one or more active magnetic fields.

In Example 21, the subject matter of Example 20 includes, adjusting the subsequent current through the at least one magnetic field source based on a difference between the coil current and the initial current corresponding to the target value.

In Example 22, the subject matter of Examples 20-21 includes, wherein the signal is indicative of the magnetic field magnitude of the one or more active magnetic fields, and the method further comprises: adjusting the subsequent current through the at least one magnetic field source based on a difference between the magnetic field magnitude of the one or more active magnetic fields and a magnitude field magnitude corresponding to the target value.

In Example 23, the subject matter of Examples 20-22 includes, wherein the signal is indicative of the magnetic field polarity of the one or more active magnetic fields, and the method further comprises: adjusting the subsequent current through the at least one magnetic field source based on the magnetic field polarity of the one or more active magnetic fields and a magnetic field polarity corresponding to the target value.

In Example 24, the subject matter of Examples 19-23 includes, periodically detecting the signal representing the one or more active magnetic fields; and periodically adjusting the subsequent current through the at least one magnetic field source based on the signal representing the one or more active magnetic fields.

Example 25 is at least one machine-readable medium including instructions that, when executed by processing circuitry, cause the processing circuitry to perform operations to implement any of Examples 1-24.

Example 26 is an apparatus comprising means to implement any of Examples 1-24.

Example 27 is a system to implement any of Examples 1-24.

Example 28 is a method to implement any of Examples 1-24.

Throughout this specification, plural instances may implement components, operations, or structures described as a single instance. Although individual operations of one or more methods are illustrated and described as separate operations, one or more of the individual operations may be performed concurrently, and nothing requires that the operations be performed in the order illustrated. Structures and functionality presented as separate components for example configurations may be implemented as a combined structure or component. Similarly, structures and functionality presented as a single component may be implemented as separate components. These and other variations, modifications, additions, and improvements fall within the scope of the subject matter herein.

The embodiments illustrated herein are described in sufficient detail to enable those skilled in the art to practice the teachings disclosed. Other embodiments may be used and derived therefrom, such that structural and logical substitutions and changes may be made without departing from the scope of this disclosure. The Detailed Description, therefore, is not to be taken in a limiting sense, and the scope of various embodiments is defined only by the appended claims, along with the full range of equivalents to which such claims are entitled.

The claims may not set forth every feature disclosed herein as embodiments may feature a subset of said features. Further, embodiments may include fewer features than those disclosed in a particular example. Thus, the following claims are hereby incorporated into the Detailed Description, with a claim standing on its own as a separate embodiment.

As used herein, the term "or" may be construed in either an inclusive or exclusive sense. Moreover, plural instances may be provided for resources, operations, or structures described herein as a single instance. Additionally, boundaries between various resources, operations, modules, engines, and data stores are somewhat arbitrary, and particular operations are illustrated in a context of specific illustrative configurations. Other allocations of functionality are envisioned and may fall within the scope of various embodiments of the present disclosure. In general, structures and functionality presented as separate resources in the example configurations may be implemented as a combined structure or resource. Similarly, structures and functionality presented as a single resource may be implemented as separate resources. These and other variations, modifications, additions, and improvements fall within a scope of embodiments of the present disclosure as represented by the appended claims. The specification and drawings are, accordingly, to be regarded in an illustrative rather than a restrictive sense.

What is claimed is:

1. A substrate processing apparatus, comprising:
a vacuum chamber including a processing zone for processing a substrate using plasma;
at least one magnetic field source configured to generate one or more active magnetic fields through the processing zone of the vacuum chamber;
a magnetic field sensor configured to detect a signal representing the one or more active magnetic fields; and
a controller coupled to the magnetic field sensor and the at least one magnetic field source, wherein to perform adjustment of the at least one magnetic field source, the controller is configured to:
determine a target value corresponding to at least one characteristic of the one or more active magnetic fields;
set an initial current through the at least one magnetic field source, the initial current corresponding to the target value;
adjust a subsequent current through at least one coil of the at least one magnetic field source based on a difference between a coil current of the at least one coil and the initial current corresponding to the target value; and
update the target value based on the difference to generate an updated target value.

2. The apparatus of claim 1, wherein the at least one characteristic comprises one or more of:
the coil current associated with the at least one coil;
magnetic field magnitude of the one or more active magnetic fields; and
magnetic field polarity of the one or more active magnetic fields.

3. The apparatus of claim 2, wherein the controller is further configured to:
repeat the adjustment of the at least one magnetic field source based on the updated target value.

4. The apparatus of claim 2, wherein the detected signal is indicative of the magnetic field magnitude of the one or more active magnetic fields and the controller is further configured to:
adjust the subsequent current through the at least one magnetic field source based on a difference between the magnetic field magnitude of the one or more active magnetic fields and a magnitude field magnitude corresponding to the target value.

5. The apparatus of claim 2, wherein the detected signal is indicative of the magnetic field polarity of the one or more active magnetic fields and the controller is further configured to:
adjust the subsequent current through the at least one magnetic field source based on the magnetic field polarity of the one or more active magnetic fields and a magnetic field polarity corresponding to the target value.

6. The apparatus of claim 1, wherein the controller is further configured to:
receive the target value as a user input using at least one user interface.

7. The apparatus of claim 1, wherein the at least one magnetic field source comprises at least one coil of a pre-determined diameter, the at least one coil being substantially parallel to a surface of the substrate when the substrate is positioned in the vacuum chamber.

8. The apparatus of claim 1, wherein the at least one magnetic field source comprises at least two coils, the at least two coils having different diameters.

9. The apparatus of claim 8, wherein a first coil of the at least two coils is substantially parallel to a surface of the substrate when the substrate is positioned in the vacuum chamber.

10. The apparatus of claim 9, wherein a second coil of the at least two coils is substantially orthogonal to a surface of the substrate when the substrate is positioned in the vacuum chamber.

11. The apparatus of claim 1, wherein one or both of the magnetic field sensor and the at least one magnetic field source are mounted externally to the vacuum chamber.

12. The apparatus of claim 1, wherein the magnetic field sensor is configured to periodically detect the signal representing the one or more active magnetic fields, and wherein the controller is further configured to:
periodically adjust the subsequent current through the at least one magnetic field source based on the signal representing the one or more active magnetic fields.

13. A magnetic field controller, comprising:
a first terminal coupled to a direct current (DC) voltage source;
a second terminal communicatively coupled to one or more vacuum chambers, each of the one or more vacuum chambers including a processing zone for processing a substrate using plasma;
a third terminal communicatively coupled to one or more magnetic field sources, each of the one or more magnetic field sources configured to generate one or more active magnetic fields through the processing zone of at least one of the one or more vacuum chambers;
a fourth terminal communicatively coupled to one or more magnetic field sensors configured to detect a signal representing the one or more active magnetic fields; and
processing circuitry communicatively coupled to the first, second, third, and fourth terminals, wherein to perform adjustment of the one or more magnetic field sources, the processing circuitry is configured to:
determine a target value corresponding to at least one characteristic of the one or more active magnetic fields;
set an initial current through the one or more magnetic field sources, the initial current corresponding to the target value; and
adjust a subsequent current through one or more coils of the one or more magnetic field sources based on a difference between a coil current of the one or more coils and the initial current corresponding to the target value; and
update the target value based on the difference to generate an updated target value.

14. The magnetic field controller of claim 13, wherein the one or more magnetic field sensors are configured to periodically detect the signal representing the one or more active magnetic fields, and wherein the processing circuitry is further configured to:
  periodically adjust the subsequent current through the one or more magnetic field sources based on the signal representing the one or more active magnetic fields.

15. The magnetic field controller of claim 13, wherein the at least one characteristic comprises one or more of:
  the coil current associated with the one or more coils;
  magnetic field magnitude of the one or more active magnetic fields; and
  magnetic field polarity of the one or more active magnetic fields.

16. The magnetic field controller of claim 15, wherein the processing circuitry is further configured to:
  repeat the adjustment of the one or more magnetic field sources based on the updated target value.

17. The magnetic field controller of claim 15, wherein the detected signal is indicative of the magnetic field magnitude of the one or more active magnetic fields, and the processing circuitry is further configured to:
  adjust the subsequent current through the one or more magnetic field sources based on a difference between the magnetic field magnitude of the one or more active magnetic fields and a magnetic field magnitude corresponding to the target value.

18. The magnetic field controller of claim 15, wherein the detected signal is indicative of the magnetic field polarity of the one or more active magnetic fields, and the processing circuitry is further configured to:
  adjust the subsequent current through the one or more magnetic field sources based on the magnetic field polarity of the one or more active magnetic fields and a magnetic field polarity corresponding to the target value.

19. A method of controlling a magnetic field in a vacuum chamber, the method comprising:
  determining a target value corresponding to at least one characteristic of one or more active magnetic fields through a processing zone of the vacuum chamber;
  setting an initial current through at least one magnetic field source to generate the one or more active magnetic fields, the initial current corresponding to the target value;
  adjusting a subsequent current through at least one coil of the at least one magnetic field source based on a difference between a coil current of the at least one coil and the initial current corresponding to the target value; and
  updating the target value based on the difference to generate an updated target value.

20. The method of claim 19, wherein the at least one characteristic comprises one or more of:
  the coil current associated with the at least one coil;
  magnetic field magnitude of the one or more active magnetic fields; and
  magnetic field polarity of the one or more active magnetic fields.

21. The method of claim 20, further comprising:
  repeating the adjusting based on the updated target value.

22. The method of claim 20, further comprising:
  detecting a signal representing the one or more active magnetic fields via a magnetic field sensor, wherein the signal is indicative of the magnetic field magnitude of the one or more active magnetic fields; and
  adjusting the subsequent current through the at least one magnetic field source based on a difference between the magnetic field magnitude of the one or more active magnetic fields and a magnitude field magnitude corresponding to the target value.

23. The method of claim 20, further comprising:
  detecting a signal representing the one or more active magnetic fields via a magnetic field sensor, wherein the signal is indicative of the magnetic field polarity of the one or more active magnetic fields; and
  adjusting the subsequent current through the at least one magnetic field source based on the magnetic field polarity of the one or more active magnetic fields and a magnetic field polarity corresponding to the target value.

24. The method of claim 19, further comprising:
  periodically detecting a signal representing the one or more active magnetic fields via a magnetic field sensor associated with the at least one magnetic field source;
  periodically adjusting the subsequent current through the at least one magnetic field source based on the signal representing the one or more active magnetic fields; and
  repeating the adjusting based on the updated target value.

* * * * *